(12) United States Patent
Hwang et al.

(10) Patent No.: US 7,803,650 B2
(45) Date of Patent: Sep. 28, 2010

(54) SENSOR THIN FILM TRANSISTOR, THIN FILM TRANSISTOR SUBSTRATE HAVING THE SAME, AND METHOD OF MANUFACTURING THE SAME

(75) Inventors: Tae-Hyung Hwang, Seoul (KR); Hyung-Il Jeon, Incheon (KR); Ivan Nikulin, Tula (RU)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 12/202,090

(22) Filed: Aug. 29, 2008

(65) Prior Publication Data
US 2009/0078972 A1    Mar. 26, 2009

(30) Foreign Application Priority Data
Sep. 21, 2007    (KR) .................. 10-2007-0096723

(51) Int. Cl.
*H01L 21/00*    (2006.01)

(52) U.S. Cl. .................. 438/57; 438/148; 438/151; 438/152; 438/164

(58) Field of Classification Search .............. 438/57, 438/148, 151, 152, 164
See application file for complete search history.

(56) References Cited

FOREIGN PATENT DOCUMENTS

| JP | 1992-044392 | 3/1992 |
|----|-------------|--------|
| JP | 1994-216736 | 8/1994 |
| JP | 2000-330090 | 11/2000 |
| KR | 2001-083153 | 8/2001 |

*Primary Examiner*—Long Pham
(74) *Attorney, Agent, or Firm*—Innovation Counsel LLP

(57) ABSTRACT

A sensor thin film transistor includes a gate electrode, a gate insulation layer formed on the gate electrode, a semiconductor layer having a portion positioned above the gate electrode and on a side of the gate insulation layer opposite the gate electrode, and a source electrode and drain electrode having spaced apart ends positioned on the semiconductor layer, wherein the sensor thin film transistor is operative such that a signal-to-noise ratio is equal to or greater than about 200 when the gate-off voltage applied to the gate electrode is equal to or less than about 0V.

6 Claims, 28 Drawing Sheets

SENSOR THIN FILM TRANSISTOR, THIN FILM TRANSISTOR SUBSTRATE HAVING THE SAME, AND METHOD OF MANUFACTURING THE SAME

CROSS-REFERENCE TO RELATED APPLICATION

This application claims the benefit of priority to Korean Patent Application No. 10-2007-0096723, filed on Sep. 21, 2007 in the Korean Intellectual Property Office, the disclosure of which is hereby incorporated herein by reference in its entirety for all purposes.

BACKGROUND OF THE INVENTION

1. Field of the Invention

The present disclosure relates to a sensor thin film transistor ("TFT") and a TFT substrate having the same.

2. Description of the Related Art

With the development of information devices, an introduction of an efficient input means as an interface between a human being and a machine is in demand. Touch screen panels that serve as an input means and operate as a display means when the input function is not used are of interest.

A touch screen panel may be separately attached on an image display panel of an information display device or may be included in the image display panel of the information display device. When the touch screen panel is separately attached on the image display panel, image display quality is typically lowered due to low transmissivity of the information display device. Accordingly, the touch screen panel included in the image display panel has been developed. Touch screen panels may be classified into a light sensing type, an ultrasonic type, a capacitance type, and a resistive type. The light sensing type is suitable for the touch screen panel included in the image display panel.

A touch screen panel of the light sensing type includes a driving thin film transistor for driving pixels and a light sensor for sensing light. A semiconductor channel of the light sensor is made of amorphous silicon formed by a high-temperature deposition process, like a semiconductor channel of the driving TFT. However, since a signal-to-noise (S/N) ratio of the light sensor is low, the light sensitivity of the light sensor is reduced. Also, it is difficult to improve the S/N ratio of the light sensor because background noise is also amplified when a signal is amplified.

SUMMARY OF THE INVENTION

The present invention provides a sensor TFT formed by a low-temperature deposition process, a TFT substrate including the sensor TFT, and a method of manufacturing the TFT substrate.

In one exemplary embodiment, a sensor TFT includes a gate electrode, a gate insulation layer formed on the gate electrode, a semiconductor layer having a portion positioned above the gate electrode and on a side of the gate insulation layer opposite the gate electrode and a source electrode and a drain electrode having spaced apart ends positioned on the semiconductor layer wherein the sensor thin film transistor is operative such that a signal-to-noise ratio is equal to or greater than about 200 when the gate-off voltage applied to the gate electrode is equal to or less than about 0V.

The gate-off voltage may be about 0V to about −10V.

The sensor TFT may be operative such that a first current flows in the semiconductor layer when light is incident on the sensor TFT and a second current flows in the semiconductor layer when light is not incident on the sensor TFT.

The first current may flow into the semiconductor layer when the external light exists and the second current flows into the semiconductor layer when the external light does not exist.

The signal-to-noise ratio may be determined by a magnitude difference between the first current and the second current.

The signal-to-noise ratio may be about 995 to about 22,200.

A minimum value of the second current may be less than about $10^{-4}$ A.

The second current may be about $5\times10^{-13}$ A to about $5\times10^{-15}$ A.

The first current may have a greater magnitude than the second current.

The semiconductor layer may include amorphous silicon.

The semiconductor layer may be formed at a temperature of about 100° C. to about 180° C.

The semiconductor layer may be formed at a temperature of about 125° C. to about 135° C.

In another exemplary embodiment, a TFT substrate includes a driving TFT connected to a gate line and a data line and driving a pixel area displaying images, and a sensor TFT to sense light incident in a pixel area, wherein the sensor TFT includes a gate electrode, a gate insulation layer formed on the gate electrode, a semiconductor layer having a portion positioned above the gate electrode and on a side of the gate insulation layer opposite the gate electrode; and a source electrode and a drain electrode having spaced apart ends positioned on the semiconductor layer, wherein the sensor TFT is operative such that a signal-to-noise ratio is equal to or greater than about 200 when the gate-off voltage applied to the gate electrode is equal to or less than about 0V.

The gate-off voltage may be about 0V to about −10V.

The signal-to-noise ratio may be about 995 to about 22,200.

A minimum value of the second current may be less than about $10^{-14}$ A.

The semiconductor layer may comprise amorphous silicon.

The semiconductor layer may be formed at a temperature of about 100° C. to about 180° C.

The semiconductor layer may be formed at a temperature of about 125° C. to about 135° C.

The driving TFT may include a second gate electrode to which a gate-off voltage is applied, a second source electrode formed on the second gate electrode, a second drain electrode facing the second source electrode, and a second semiconductor layer formed between the second source electrode and the second drain electrode.

The second semiconductor layer may be formed at a temperature of about 100° C. to about 180° C. on an identical layer to the semiconductor layer.

The second source electrode and the second drain electrodes may be formed on an identical layer to the gate electrode.

The second semiconductor layer may be formed at a temperature of about 365° C. to about 375° C. on a different layer from the semiconductor layer.

In another exemplary embodiment, a method of manufacturing a TFT substrate includes forming a first metal pattern group on a substrate, the first metal pattern group including a driving gate electrode and a sensor gate electrode, forming at a predetermined temperature a semiconductor layer on the first metal pattern group, forming a second metal pattern group on the semiconductor layer, the second metal pattern group including a driving source electrode, a driving drain electrode, a sensor drain electrode, and a sensor source electrode, forming a protective layer having a contact hole on the second metal pattern group, and forming a pixel electrode on the protective layer, wherein the semiconductor layer is formed at a temperature of about 100° C. to about 180° C.

The forming the semiconductor layer may be formed at a temperature of about 125° C. to about 135° C.

In another exemplary embodiment, a method of manufacturing a TFT includes forming a first metal pattern group including a driving gate electrode on a substrate, forming a first semiconductor layer at a first process temperature on the first metal pattern group, forming a second metal pattern group on the first semiconductor layer, the second metal pattern group including a driving source electrode, a driving drain electrode, a sensor gate electrode, forming a second semiconductor layer at a second process temperature on the second metal pattern group, forming a third metal pattern group including a sensor drain electrode and a sensor source electrode on the second semiconductor layer, forming a protective layer having a contact hole on the third metal pattern group, and forming a pixel electrode on the protective layer.

The first process temperature may be about 365° C. to about 375° C.

The second process temperature may be about 100° C. to about 180° C.

The second process temperature may be about 125° C. to about 135° C.

A better understanding of the above and many other features and advantages of the present invention disclosed herein may be obtained from a consideration of the detailed description thereof below, particularly if such consideration is made in conjunction with the several views of the appended drawings, wherein like elements are referred to by like reference numerals throughout.

BRIEF DESCRIPTION OF THE DRAWINGS

The features of the present invention will become more apparent in light of the following description and the attached drawings, in which.

DETAILED DESCRIPTION OF THE EMBODIMENTS

The present invention is described more fully hereinafter with reference to FIGS. 1 to 22B, in which exemplary embodiments of the invention are shown.

Figure 1:
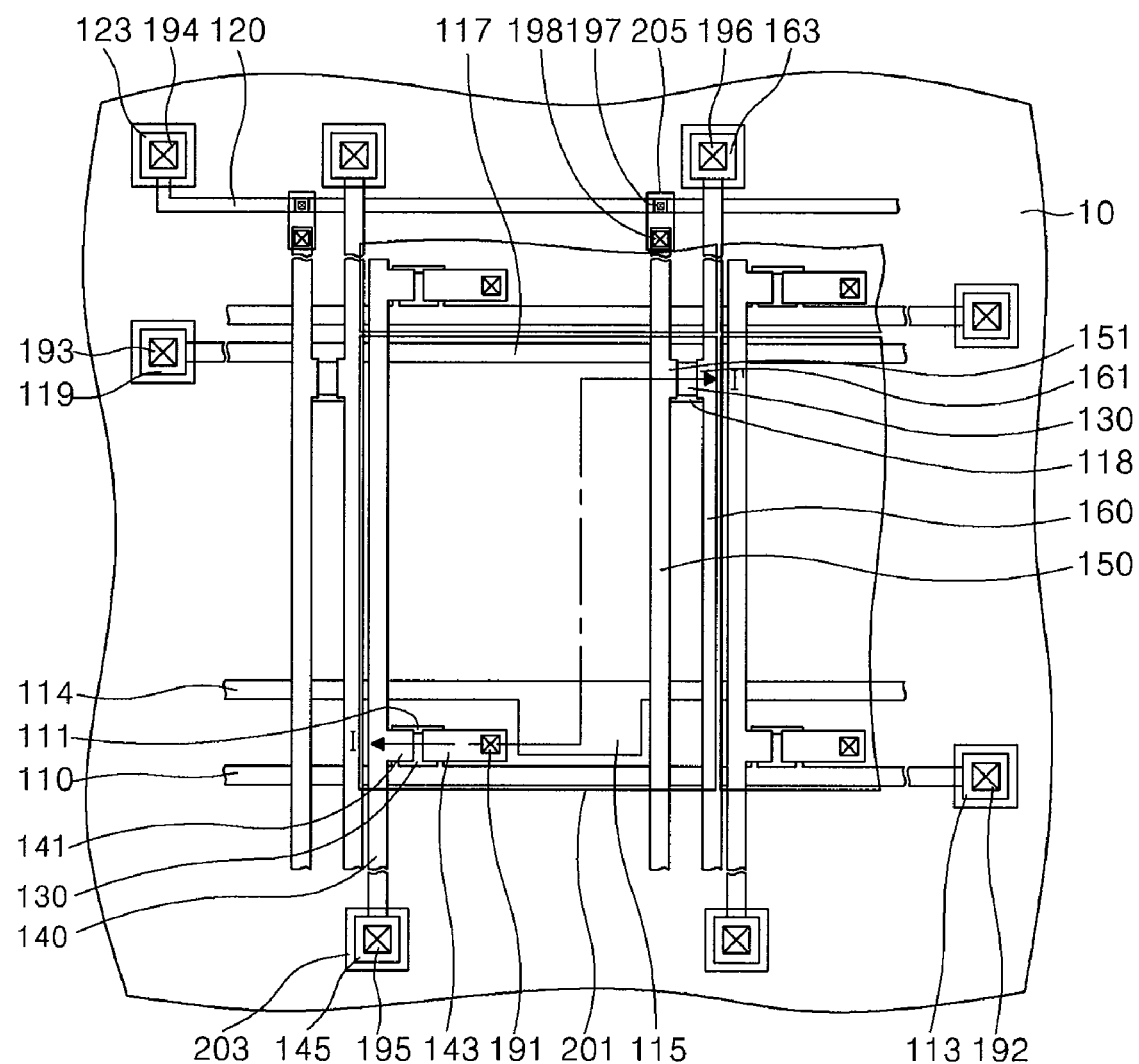
FIG. 1 is a plan view showing a thin film transistor ("TFT") substrate according to an embodiment of the present invention.
Figure 2:
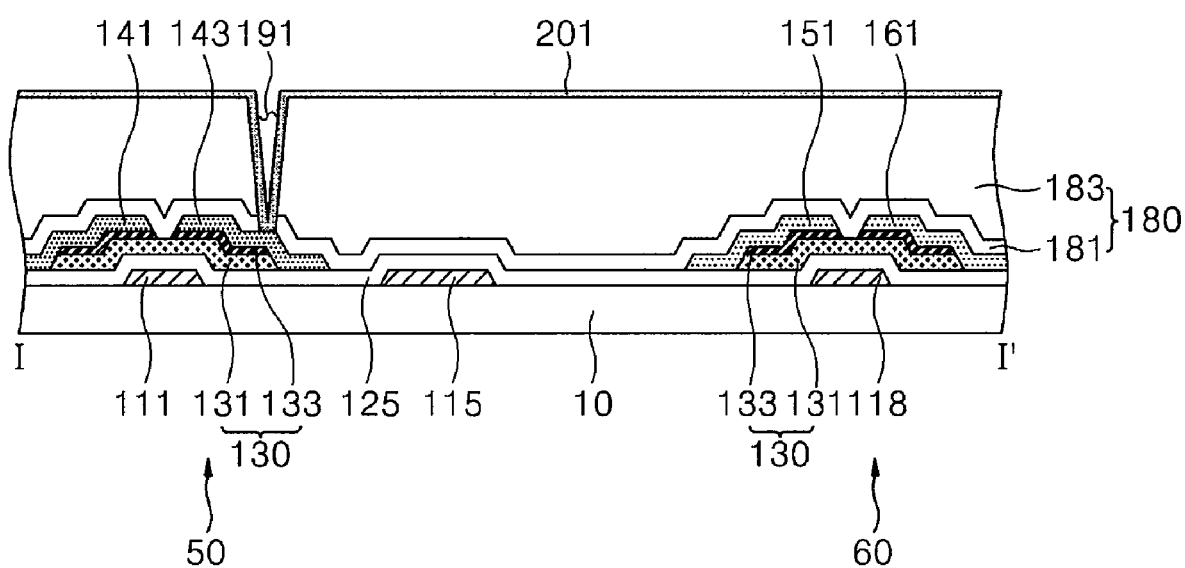
FIG. 2 is a cross-sectional view taken along line I-I' in FIG. 1.

FIG. 1 is a plan view showing a thin film transistor ("TFT") substrate according to an embodiment of the present invention, and FIG. 2 is a cross-sectional view taken along line I-I' in FIG. 1.

The TFT substrate includes a gate line 110 and a data line 140, a driving TFT 50 and a sensor TFT 60. The driving TFT 50 drives a pixel area displaying a predetermined image and the sensor TFT 60 senses light incident onto the pixel area. The TFT substrate includes the gate line 110, a storage line 114, a sensor gate line 117, a sensor data common connection line 120, a gate insulation layer 125, a semiconductor layer 130, the data line 140, a sensor data common line 150, a sensor output line 160, a protective layer 180, and a pixel electrode 201.

The gate line 110 is extended in a horizontal direction of a substrate 10. The gate line 110 includes a driving gate electrode 111 constituting the driving TFT 50 and protruding from the gate line 110. The driving gate electrode 111 is connected to the gate line 110 on the substrate 10. One end of the gate line 110 includes a gate pad 113 connected to a driving circuit (not shown). The gate pad 113 is formed with a predetermined size corresponding to a connection portion of the driving circuit.

The storage line 114 is extended in a horizontal direction of the substrate 10 in parallel with the gate line 110. The storage line 114 includes a storage electrode 115 protruding from the gate line 110. The storage electrode 115 may have various forms.

The sensor gate line 117 is formed in the vicinity of the gate line 110 in parallel with the gate line 110 in a horizontal direction. The sensor gate line 117 includes a sensor gate electrode 118 constituting the sensor TFT 60 and protruding from the sensor gate line 117. One end of the sensor gate line 117 includes a sensor gate pad 119 connected to the driving circuit.

The sensor data common connection line 120 is extended in a horizontal direction of the substrate 10 in parallel with the gate line 110. One end of the sensor data common connection line 120 includes a sensor data common connection pad 123 connected to the driving circuit. The sensor data common connection pad 123 is formed at one end of the sensor data common connection line 120. The sensor data common connection line 120 is shaped as being bent as shown FIG. 1, however it may have other various forms capable of being easily connected to the driving circuit.

The gate insulation layer 125 is formed of an insulation material over an entire surface of the substrate 10 to insulate the gate line 110, the storage line 114, and the sensor gate line 117 from other layers. For example, the gate insulation layer 125 is formed by depositing an insulation material such as silicon nitride (SiNx) or silicon oxide (SiOx) through a plasma enhanced chemical vapor deposition ("PECVD") method.

The semiconductor layer 130 is formed on the gate insulation layer 125 to overlap the driving gate electrode 111 and the sensor gate electrode 118. The semiconductor layer 130 includes an active layer 131 and an ohmic contact layer 133. The active layer 131 is formed of amorphous silicon or poly-silicon on the gate insulation layer 125. The active layer 131 overlaps the driving gate electrode 111 and the sensor gate electrode 118. The ohmic contact layer 133 is made of amorphous silicon doped with an n-type impurity, phosphorus (P) for example, or made of silicide.

The gate insulation layer 125 and the semiconductor layer 130 are formed by a low-temperature deposition process. For example, the gate insulation layer 125 and the semiconductor layer 130 may be formed at a temperature of 100° C. to 180° C., for example, at a temperature of 125° C. to 135° C. The gate insulation layer 125 and the semiconductor layer 130 may be deposited by a PECVD method under a high frequency power of about 150 W to about 300 W, for example, about 300 W.

When the gate insulation layer 125 and the semiconductor layer 130 are deposited at a temperature of 100° C. or less, the performance characteristic of the TFT may be reduced.

The semiconductor layer 130 formed by the low-temperature deposition process may generate defects on a crystalline structure of the amorphous silicon. The amorphous silicon formed by the low-temperature process forms a middle band gap for exciting energy by defects and generates current by exciting the energy supplied from external light. The semiconductor layer 130 is used for a light sensor and generates photo on current when external light exists. When there is no external light, the semiconductor layer 130 generates photo off current. The semiconductor layer 130 increases a signal-to-noise (S/N) ratio as a difference between the photo on current and the photo off current is increased. For example, the photo on current is a signal for sensing light and the photo off current is noise for sensing light. The difference between the photo on current and the photo off current is increased depending on whether there is external light and thus the S/N ratio is increased.

The data line 140 is extended in a vertical direction of the substrate 10. The data line 140 includes a driving source electrode 141 constituting the driving TFT 50 and protruding from the data line 140. The driving drain electrode 143 separated from the data line 140 faces the driving source electrode 141 with a gap therebetween based on the driving gate electrode 11. The driving drain electrode 143 is formed in an island type. The driving source electrode 141 and the driving drain electrode 143 are formed on the semiconductor layer 130 and electrically connected to each other through the semiconductor layer 130.

The sensor data common line 150 is extended in the vertical direction of the substrate 10 in parallel with the data line 140. The sensor data common line 150 includes a sensor drain electrode 151 constituting the sensor TFT 60 and protruding from the sensor data common line 150. The sensor data common line 150 is electrically connected to the sensor data common connection line 120 through a connection electrode 205 to receive a common voltage.

The sensor output line 160 is extended in the vertical direction of the substrate 10 in parallel with the sensor data common line 150. The sensor output line 160 includes a sensor source electrode 161 facing the sensor drain electrode 151 based on the gate electrode 118. The sensor source electrode 161 protrudes from the sensor output line 160. The sensor source electrode 161 and the sensor drain electrode 151 are formed on the semiconductor layer 130. The sensor source electrode 161 is electrically connected to the sensor drain electrode 151 through the semiconductor layer 130.

The protective layer 180 is formed over an entire surface of the substrate 10 on which the data line 140, the sensor data common line 150, and the sensor output line 160 are formed. The protective layer 180 includes a first protective layer 181 of an inorganic material, which may be, for example SiNx or SiOx and a second protective layer 183 made of an organic material such as, for example benzocyclobutene (BCB) formed on the first protective layer 181. The first protective layer 181 is formed on the driving TFT 50 and the sensor TFT 60. The first protective layer 181 prevents the semiconductor layers 130 of the driving TFT 50 and the sensor TFT 60 from contacting an organic material to prevent the degradation of characteristic of the TFT caused by a chemical reaction of the semiconductor layer 130. The second protective layer 183 is formed on the first protective layer 181. The second protective layer 183 is thicker than the first protective layer 181 and has a higher dielectric constant than the first protective layer 181.

The protective layer 180 includes first to eighth contact holes 191, 192, 193, 194, 195, 196, 197, and 198. The first to third contact holes 191, 192, and 193 expose portions of the driving drain electrode 143, the sensor data common connection line 130, and the sensor data common line 150, respectively. The fourth to eighth contact holes 194, 195, 196, 197, and 198 expose portions of the gate pad 113, the sensor gate pad 119, the sensor data common connection pad 123, a data pad 145, and a sensor output pad 163, respectively.

The pixel electrode 201, the connection electrode 205, and a pad connection electrode 203 are formed on the protective layer 180. The electrodes 201, 205 and 203 are made of a transparent conductive material, for example, indium tin oxide (ITO) or indium zinc oxide (IZO). The electrodes 201, 205 and 206 are electrically connected to the driving drain electrode 143, the sensor data common connection line 120, the sensor data common line 150, and the pads 113, 119, 123, 145 and 163 through the first to eighth contact holes 191, 192, 193, 194, 195, 196, 197, and 198.

A TFT substrate according to another embodiment of the present invention will be described in detail with reference to FIG. 3 and FIG. 4.

Figure 3:
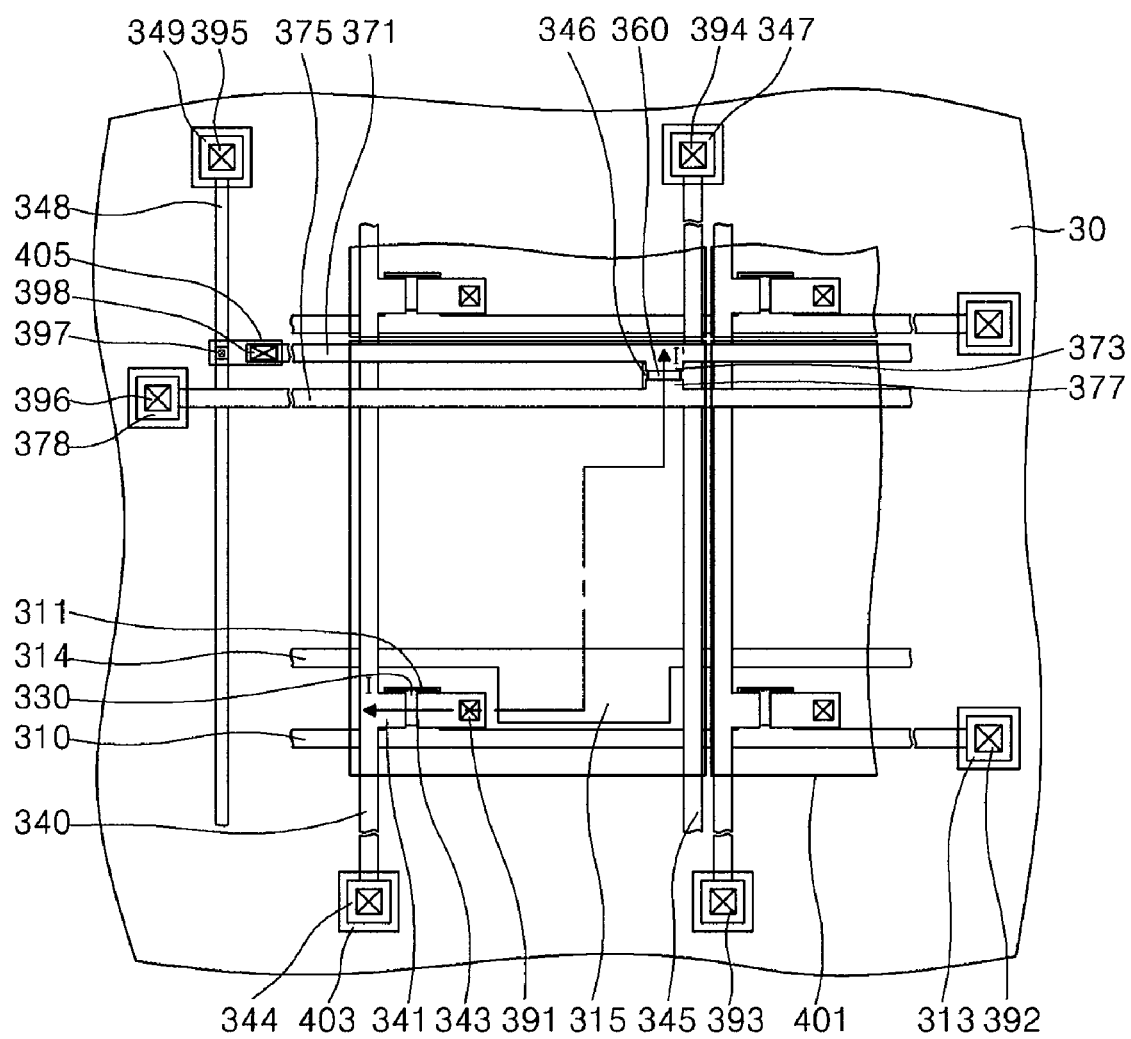
FIG. 3 is a plan view showing a TFT substrate according to another embodiment of the present invention.
Figure 4:
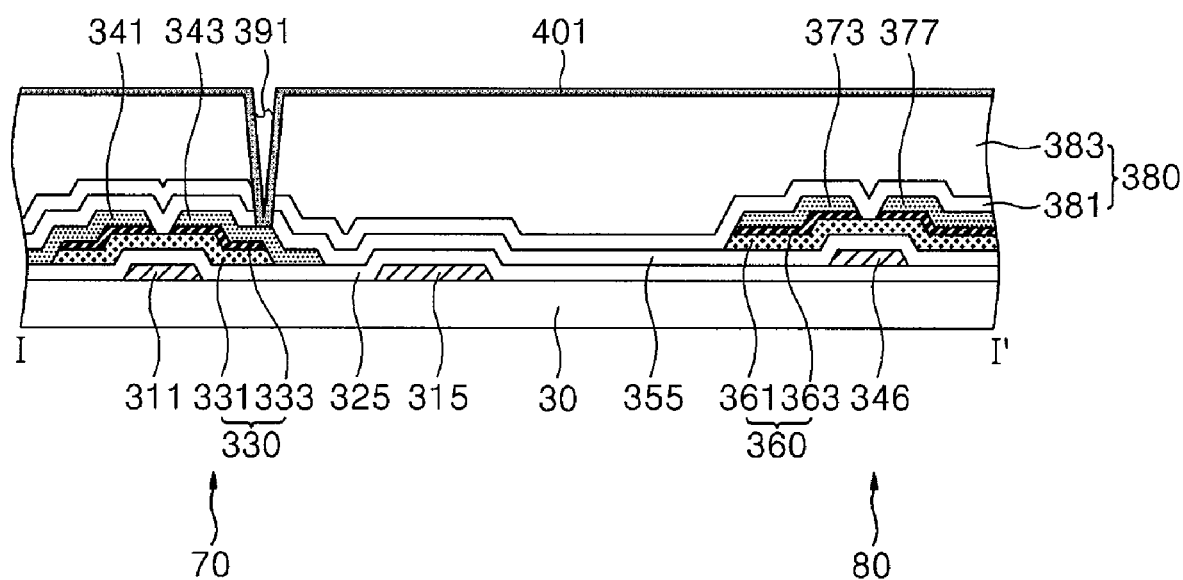
FIG. 4 is a cross-sectional view taken along line I-I' in FIG. 3.

FIG. 3 is a plan view showing the TFT substrate according to another embodiment of the present invention, and FIG. 4 is a cross-sectional view taken along line I-I' in FIG. 3.

The TFT substrate includes a gate line 310, a storage line 314, a data line 340, a driving drain electrode 343, a sensor gate line 345, a sensor data common connection line 348, a sensor data common line 371, and first and second semiconductor layers 330 and 360 that are connected to or constitute a driving TFT 70 and a sensor TFT 80.

The gate line 310 is extended in a horizontal direction of a substrate 30. The gate line 310 includes a driving gate electrode 311 constituting the driving TFT 70 and protruding from the gate line 310. The driving gate electrode 311 is connected to the gate line 310 on the substrate 30. The gate line 310 includes a gate pad 313 connected to a driving circuit (not shown). The gate pad 313 is formed with a predetermined size corresponding to a connection portion of the driving circuit.

The storage line 314 is extended in the horizontal direction of the substrate 30 in parallel with the gate line 310. The storage line 314 includes a storage electrode 315 protruding from the storage line 314 to face the gate line 310.

The first gate insulation layer 325 is formed of an insulation material over an entire surface of the substrate 30 to insulate the gate line 310 and the storage line 314 from other layers. For example, the first gate insulation layer 325 is formed by depositing an insulation material such as SiNx.

The first semiconductor layer 330 is formed to overlap the driving gate electrode 311 on the first insulation layer 325. The first semiconductor layer 330 includes a first active layer 331 and a first ohmic contact layer 333. The first active layer 331 is formed of amorphous silicon or poly silicon on the first gate insulation layer 325. The first ohmic contact layer 333 is made of amorphous silicon doped with an n-type impurity, phosphorus (P) for example, or made of silicide.

The first semiconductor layer 330 is formed by a high-temperature deposition process. For example, the first semiconductor layer 330 may be deposited at a temperature of about 365° C. to about 375° C. More specifically, the first semiconductor layer 330 may be deposited at a temperature of about 370° C. The first semiconductor layer 330 may be formed by a PECVD method.

The data line 340 is extended in a vertical direction of the substrate 30. The data line 340 includes a driving source electrode 341 constituting the driving TFT 70 and protruding from the data line 340. The driving drain electrode 343 separated from the data line 340 faces the driving source electrode 341 with a gap therebetween based on the driving gate electrode 311. The driving source electrode 341 and the driving drain electrode 343 are formed on the first semiconductor layer 330. The driving source electrode 341 is connected to the driving drain electrode 343 through the first semiconductor layer 330.

The sensor gate line 345 is formed in the vicinity of the data line 340 in parallel with the data line 340. The sensor gate line 345 includes a sensor gate electrode 346 constituting the sensor TFT 80 and protruding from the sensor gate line 345. The sensor gate line 345 includes a sensor gate pad 347 connected to the driving circuit. The sensor gate pad 347 is formed at one end of the sensor gate line 345.

The sensor data common connection line 348 is extended to in the vertical direction of the substrate 30 in parallel with the data line 340. The sensor data common connection line 348 includes a sensor data common connection pad 349 connected to the driving circuit. The sensor data common connection pad 349 is formed at one end of the sensor data common connection line 348.

The second insulation layer 355 is formed of an insulation material over an entire surface of the substrate 30 to insulate the data line 340, the sensor gate electrode 346, and the sensor data common connection line 348 from other layers. The second insulation layer 355 may be formed of materials identical with that of the first gate insulation layer.

The second semiconductor layer 360 is formed to overlap the sensor gate electrode 346 on the second insulation layer 355. The second semiconductor layer 360 includes a second active layer 361 and a second ohmic contact layer 363. The second active layer 361 is formed of amorphous silicon etc. on the second gate insulation layer 335. The second ohmic contact layer 363 is made of amorphous silicon doped with an n-type impurity, phosphorus (P) for example, or made of silicide.

The second semiconductor layer 360 is formed by a low-temperature deposition process. For example, the second semiconductor layer 360 may be deposited at a temperature of about 100° C. to about 180° C. More specifically, the second semiconductor layer 360 may be deposited at a temperature of about 125° C. to about 135° C., for example, about 130° C. The second semiconductor layer 360 may be deposited by a PECVD method under a high frequency power of about 300 W. And, the second semiconductor layer 360 may be deposited by the PECVD method under a high frequency power of about 150 W to about 300 W.

The sensor data common line 371 is extended in the horizontal direction of the substrate 30. The sensor data common line 371 includes a sensor drain electrode 373.

The sensor output line 375 is extended in the horizontal direction of the substrate 30. The sensor output line 375 includes a sensor source electrode 377 facing the sensor drain electrode 373 based on the sensor gate electrode 346.

The protective layer 380 is formed over an entire surface of the substrate 30 on which the sensor data common line 371 and the sensor output line 375 are formed. The protective layer 380 includes a first protective layer 381 and a second protective layer 383 formed on the first protective layer 381. The first protective layer 381 may be made of an inorganic material to prevent the characteristic degradation of the sensor TFT 80. The second protective layer 383 may be made of organic material with a thicker thickness than the first protective layer 381. The protective layer 380 includes first to eighth contact holes 391, 392, 393, 394, 395, 396, 397, and 398 exposed to portions of the driving drain electrode 343, the sensor data common connection line 348, the sensor data common line 371, and each pad of lines 313, 344, 347, 349, and 378.

A pixel electrode 401, a connection electrode 405 and a pad connection electrode 403 are formed on the protective layer 380 and are made of transparent conductive material. For example, the pixel electrode 401, the connection electrode 405, and the pad connection electrode 403 are made of ITO or IZO. The pixel electrode 401, the connection electrode 405, and the pad connection electrode 403 are electrically connected to the driving drain electrode 434, the sensor data common connection line 348, the sensor data common line 371 and the each pad of the lines 313, 344, 347, 349, and 378 through the first to eighth contact holes 391, 392, 393, 394, 395, 396, 397, and 398.

A relationship between light sensitivity of a sensor TFT and a process temperature according to an embodiment of the present invention is described below in detail with reference to FIG. 5 and FIG. 6.

Figure 5:
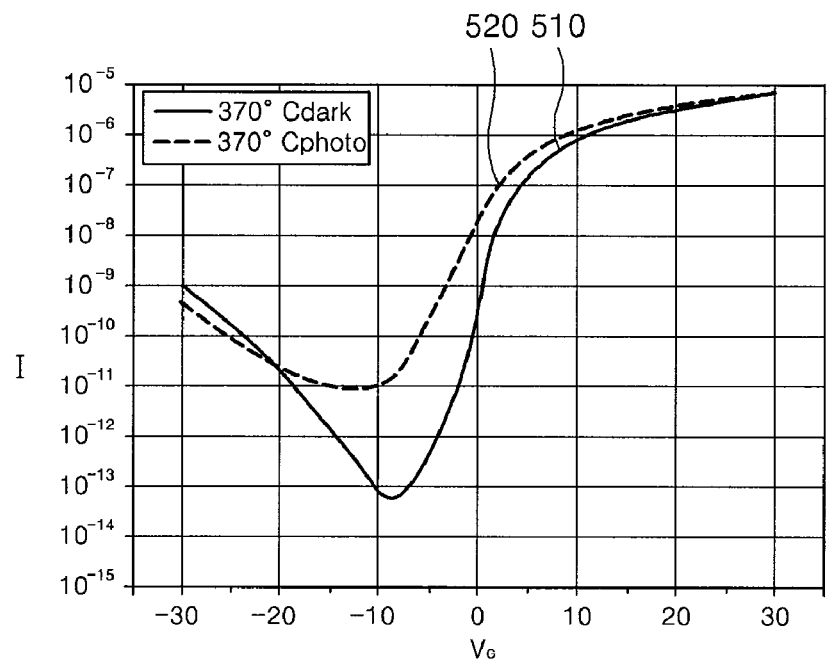
FIG. 5 is a plot illustrating a relationship between voltage and current in forming a sensor TFT by a high-temperature deposition process.
Figure 6:
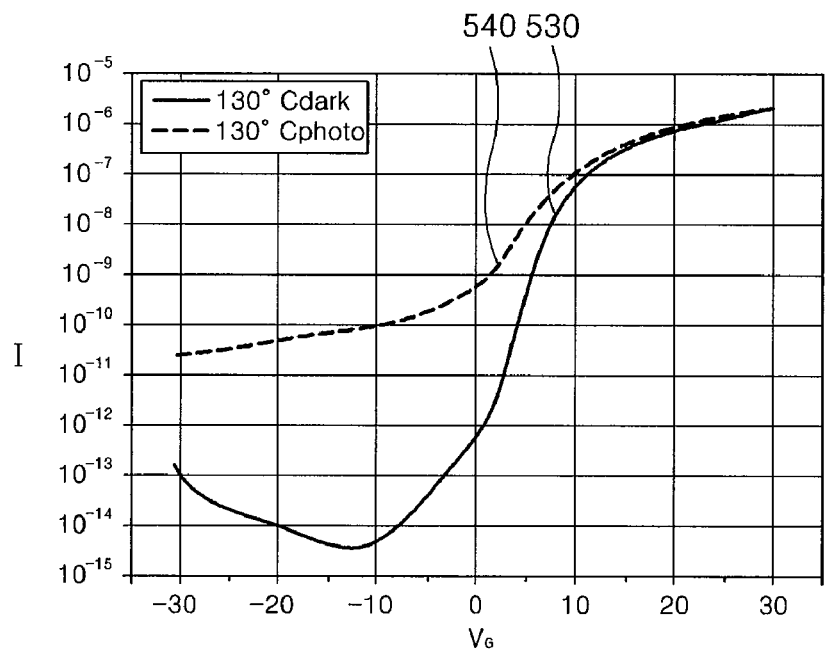
FIG. 6 is a plot illustrating a relationship between voltage and current in forming a sensor TFT by a low-temperature deposition process according to an embodiment of the present invention.

FIG. 5 is a graph illustrating a relationship between a voltage and a current in forming a sensor TFT by a high-temperature deposition process according to an embodiment of the present invention, and FIG. 6 is a graph illustrating a relationship between a voltage and a current in forming a sensor TFT by a low-temperature deposition process according to an embodiment of the present invention.

In FIG. 5 and FIG. 6, a horizontal-axis indicates a gate voltage ($V_G$) and a vertical-axis indicates a current (I) in units of ampere. Graphs for voltage-current relationships at temperatures 370° C. and 130° C. are shown as examples for a high temperature and a low temperature, respectively.

The sensor TFT is formed in a triple layer structure of a gate insulation layer, an active layer, and an ohmic contact layer by a high-temperature deposition process at 370° C. A first curve 510 shows a gate voltage-photo off current relationship when light is not incident on the sensor TFT formed by a high-temperature deposition process at 370° C. A second curve 520 shows a gate voltage-photo on current relationship when light is incident on the sensor TFT formed by a high-temperature deposition process at 370° C.

Referring to FIG. 6, the sensor TFT is formed in a triple layer structure of the gate insulation layer, the active layer, and the ohmic contact layer by a low-temperature deposition process at 130° C. A third curve 530 shows a gate voltage-photo off current relationship when light is not entered to the sensor TFT formed by the low-temperature deposition process at 130° C. A fourth curve 540 shows a gate voltage-photo on current relationship when light is entered to the sensor TFT formed by the low-temperature deposition process at 130° C.

An S/N ratio affecting the light sensitivity of the sensor TFT is increased as a difference between the photo on current and the photo off current is increased. When user input is sensed under the state where there is external light and thus the photo on current flows, a photo off current flows into the sensor TFT since the external light is cut off. The sensor TFT determines the user input by the difference between the photo on current and the photo off current. Since the S/N ratio is increased as the difference between the photo on current and the photo off current is increased, the light sensitivity of the sensor TFT is improved so that the sensing ability of the user input is improved.

The sensor TFT shows S/N ratios as shown in Table 1 according to a process temperature in forming the triple layer.

TABLE 1

| Gate voltage | classification | 370° C. | 130° C. |
|---|---|---|---|
| 0 V | Photo off current | $3.19 \times 10^{-10}$ A | $5.97 \times 10^{-13}$ A |
|  | Photo on current | $1.88 \times 10^{-08}$ A | $5.94 \times 10^{-10}$ A |
|  | S/N ratio | 59 | 995 |
| −10 V | Photo off current | $7.45 \times 10^{-14}$ A | $4.60 \times 10^{-15}$ A |
|  | Photo on current | $1.09 \times 10^{-11}$ A | $1.02 \times 10^{-10}$ A |
|  | S/N ratio | 146 | 22,200 |

Referring to table 1, when the gate voltages are 0V and −10V, values of the photo off current of the first curve 510 are about $3.19 \times 10^{-10}$ A and about $7.45 \times 10^{-14}$ A, respectively. When the gate voltages are 0V and −10V, values of the photo on current of the second curve 520 are about $1.88 \times 10^{-08}$ A and about $1.09 \times 10^{-11}$ A, respectively. When the gate voltages are 0V and −10V, the S/N ratios of the sensor TFT are about 59 and about 995, respectively. That is, when the gate voltage of 0V or less is applied to the sensor TFT formed by the high-temperature deposition process at 370° C., the S/N ratio is less than 200 so that it is not enough to sense light.

When the gate voltages are 0V and −10V, values of the photo off current of the third curve 530 are about $5.97 \times 10^{-13}$ A and about $4.60 \times 10^{-15}$ A, respectively. When the gate voltages are 0V and −10V, values of the photo on current of the fourth curve 540 are about $5.94 \times 10^{-10}$ A and about $1.02 \times 10^{-10}$ A, respectively. When the gate voltages are 0V and −10V, the S/N ratios of the sensor TFT are about 995 and about 22,200, respectively. Namely, when the gate voltage of 0V or less is applied to the sensor TFT formed by the low-temperature deposition process at 130° C., the S/N ratio is over 200 so that the sensor TFT has improved light sensitivity.

The triple layer formed by the low-temperature deposition process at 130° C. may be formed of a sensor diode instead of the sensor TFT. Then the sensor diode may have a higher S/N ratio than the sensor TFT formed by the high-temperature deposition process at 370° C. Therefore, the sensor diode formed by the low-temperature deposition process may be substituted for the sensor TFT.

A method of manufacturing a TFT substrate according to an embodiment of the present invention is described below in detail with reference to FIG. 7A to FIG. 13B.

The method of manufacturing the TFT substrate includes forming a first metal pattern group, forming a triple layer, forming a second metal pattern group, forming a protective layer, and forming a third metal pattern group.

Figure 7A:
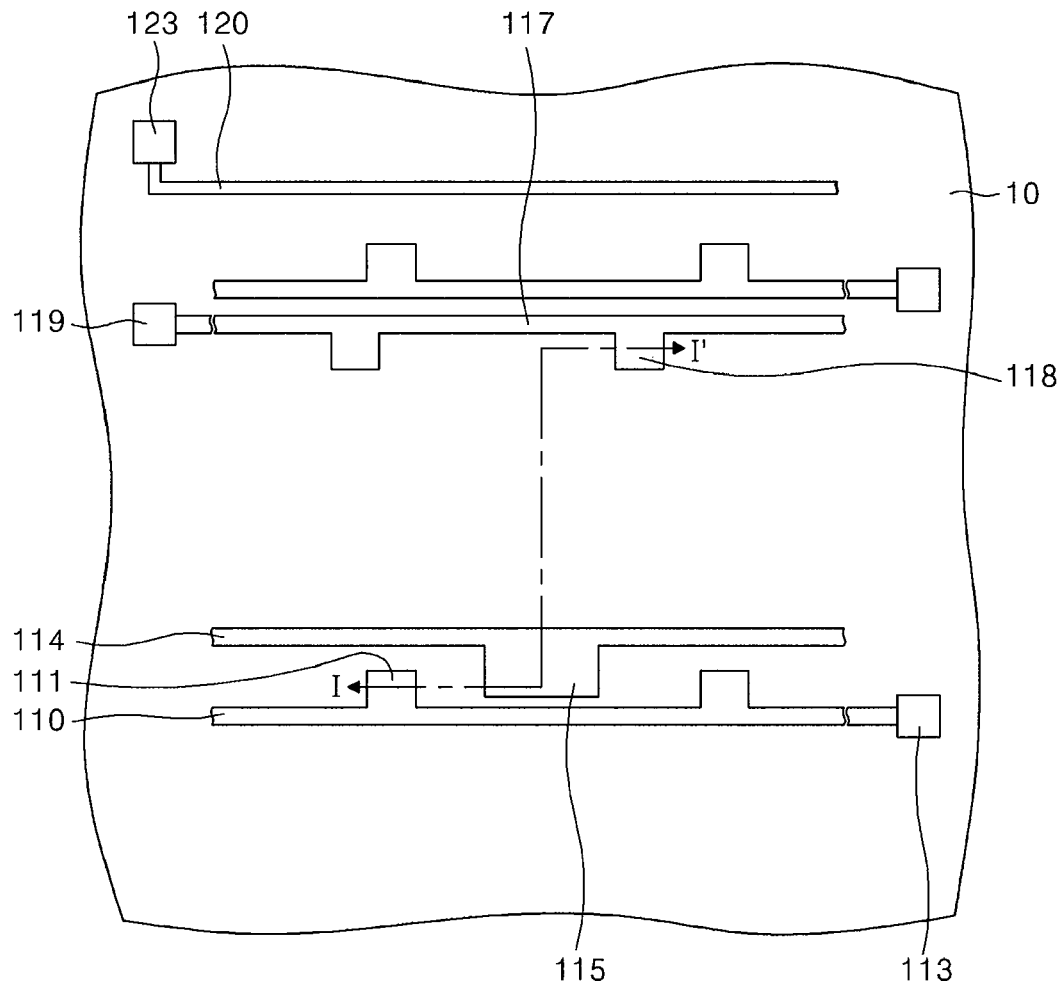
FIG. 7A to FIG. 13B are views illustrating a method of manufacturing a TFT substrate according to a first embodiment of the present invention.
Figure 7B:
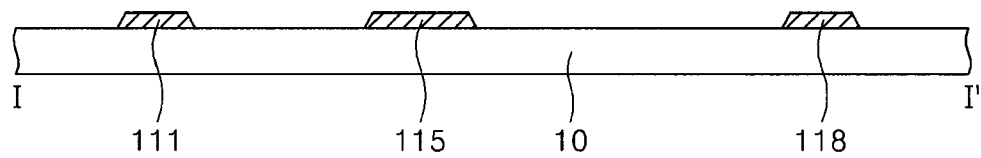

Referring to FIG. 7A and FIG. 7B, a first metal pattern group is formed on a substrate 10. The first metal pattern group includes a gate line 110, a driving gate electrode 11, a gate pad 113, a storage line 114, a storage electrode 115, a sensor gate line 117, a sensor gate electrode 118, a sensor gate pad 119, a sensor data common connection line 120, and a sensor data common connection pad 123.

More specifically, the first metal pattern group is formed on the substrate 10 by forming a metal layer by a deposition method such as sputtering and by patterning the metal layer through a photolithography process and an etching process. The substrate 10 is a transparent insulating substrate such as glass or plastic. The gate line 110, the sensor gate line, and the sensor data common connection line 120 are extended in a transverse direction on the substrate 10. The driving gate electrode 111, the storage electrode 115, and the sensor gate electrode 118 protrude from the gate line 110, the storage line 114 and the sensor gate line 117, respectively.

Figure 8:
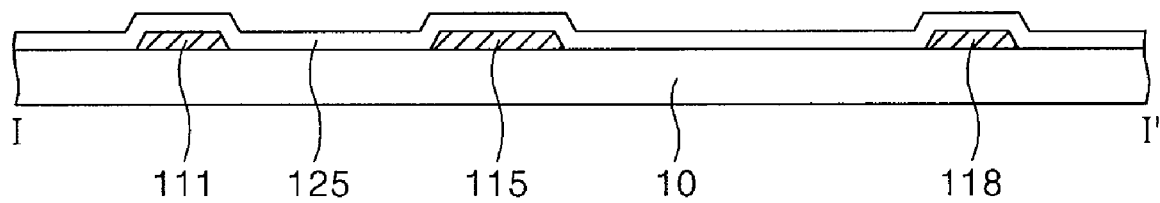
Figure 9A:
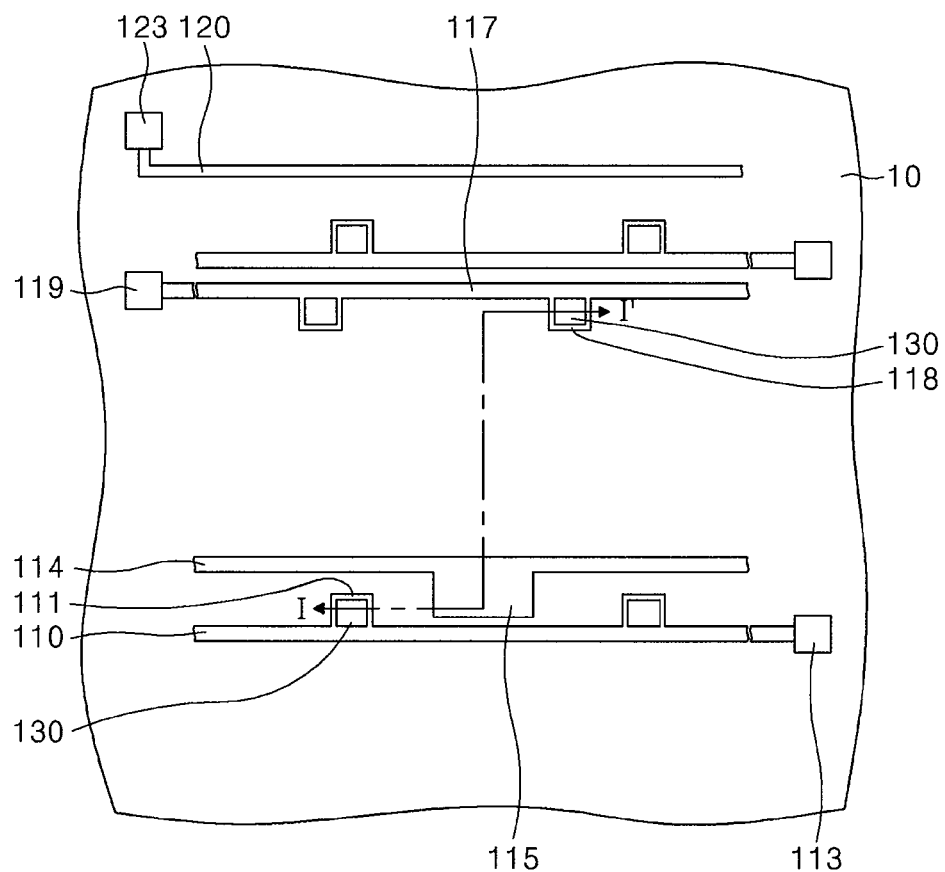
Figure 9B:
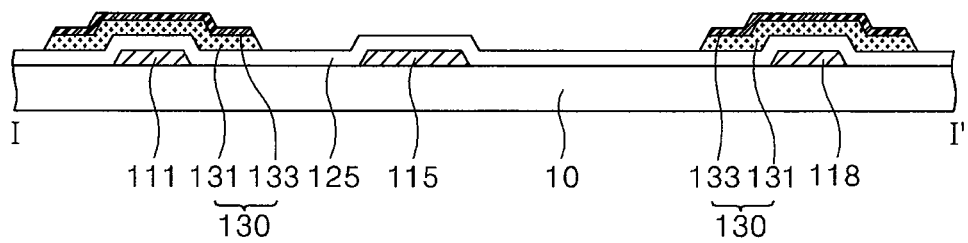

Referring to FIG. 8 to FIG. 9B, a triple layer is formed on the first metal pattern group. The triple layers include a gate insulation layer 125, an active layer 131, and an ohmic contact layer 133.

More specifically, the gate insulation layer 125 is formed over an entire surface of the substrate 10. The active layer 131 and the ohmic contact layer 133 are sequentially stacked on the gate insulation layer 120. The active layer 131 and the ohmic contact layer 133 are patterned in portions where the active layer 131 and the ohmic contact layer 133 overlap the driving gate electrode 111 and the sensor gate electrode 118.

The triple layer is formed by a low-temperature deposition process. For example, the triple layer is formed by a PECVD method at a temperature of about 100° C. to about 180° C. and a high frequency power of 300 W or less. The triple layers may be formed at a temperature of about 130° C. and a high frequency power of about 150 W to about 300 W.

Figure 10A:
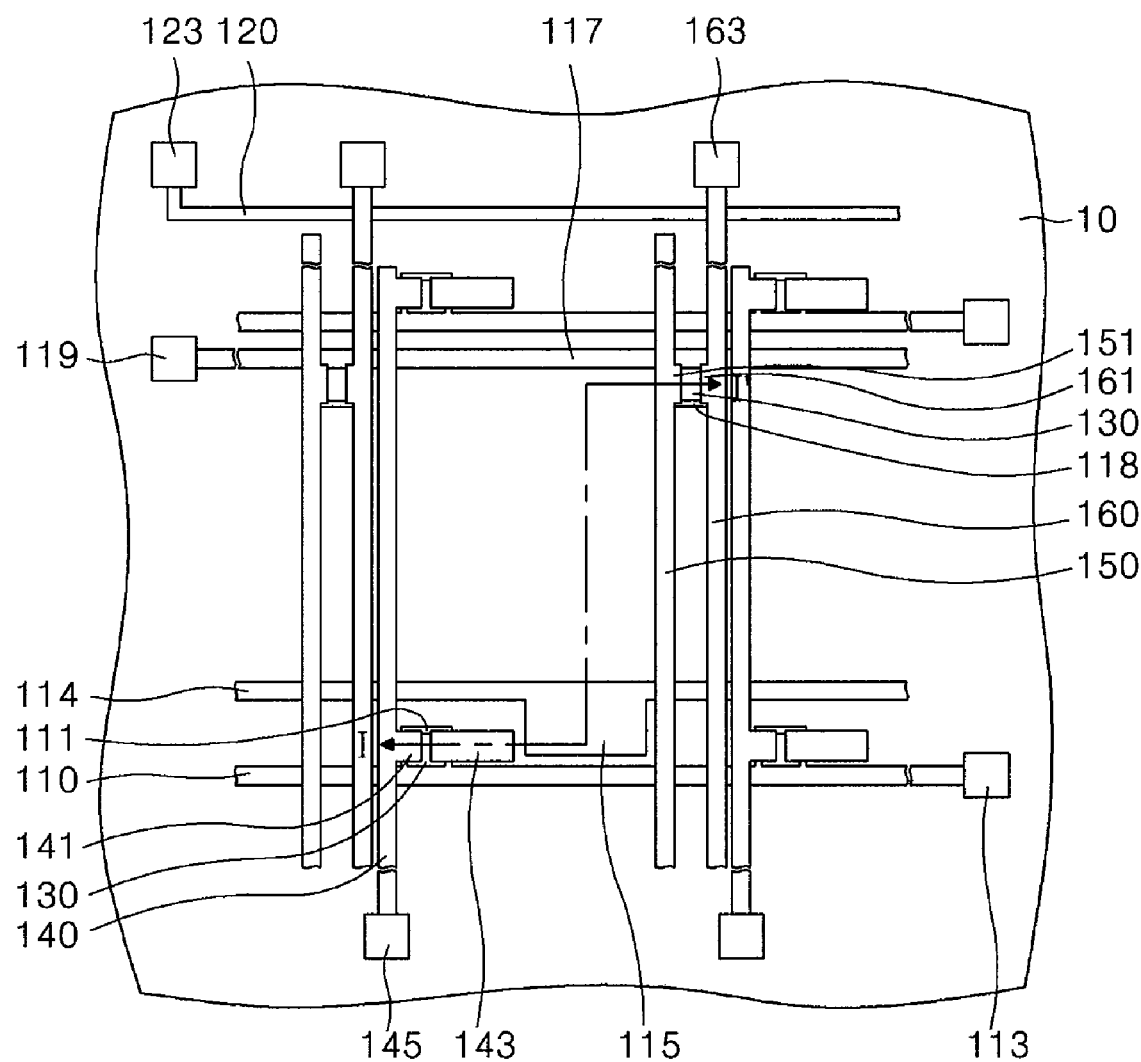
Figure 10B:
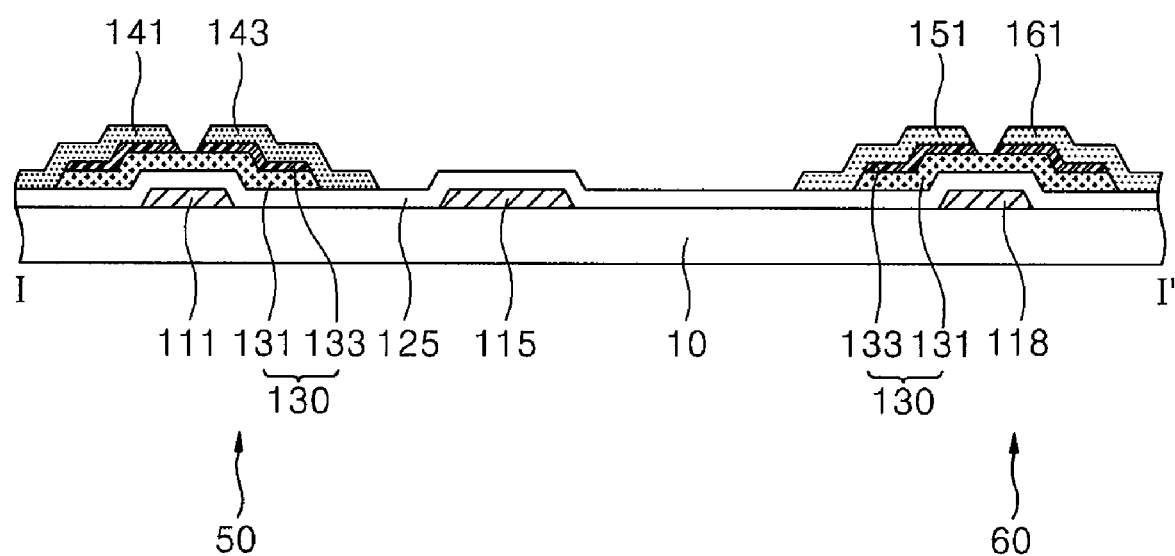

Referring to FIG. 10A and FIG. 10B, a second metal pattern group is formed on the triple layer. The second metal pattern group includes a data line 140, a driving source electrode 141, a driving drain electrode 143, a data pad, 145, a sensor data common line 150, a sensor drain electrode 151, a sensor output line 160, a sensor source electrode 161, and a sensor output pad 163.

More specifically, the data line 140 is patterned to be extended in a vertical direction of the substrate 10. The driving source electrode 141 protruding from the data line 140 and the driving drain electrode 143 facing the driving source electrode 141 are patterned.

The sensor data common line 150 and the sensor output line 160 are patterned to be extended in the vertical direction of the substrate in parallel with each other. The sensor drain electrode 151 and the sensor source electrode 161 are patterned to be protruded based on the sensor gate electrode 118.

Figure 11:
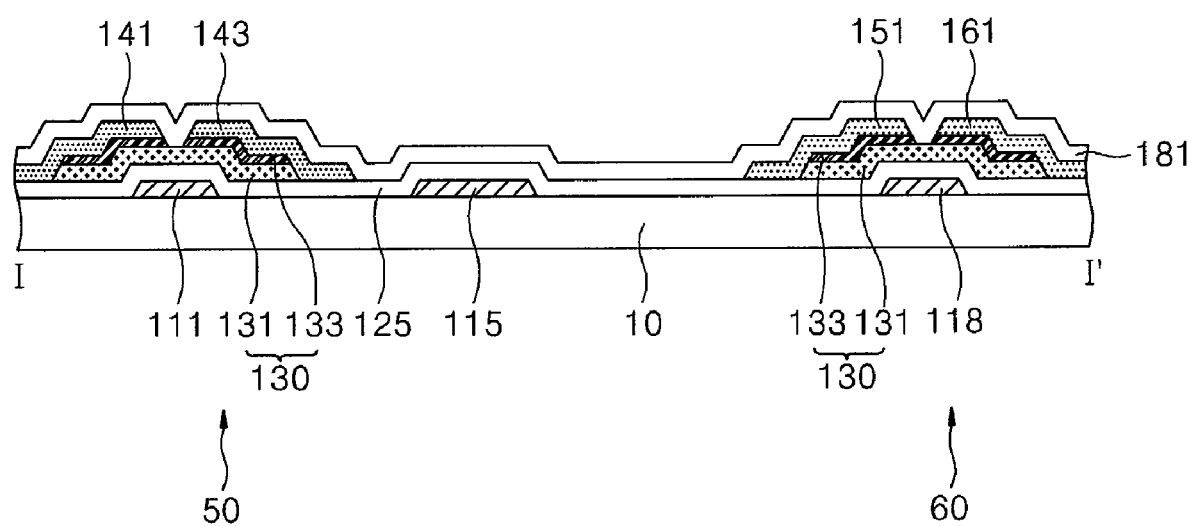
Figure 12A:
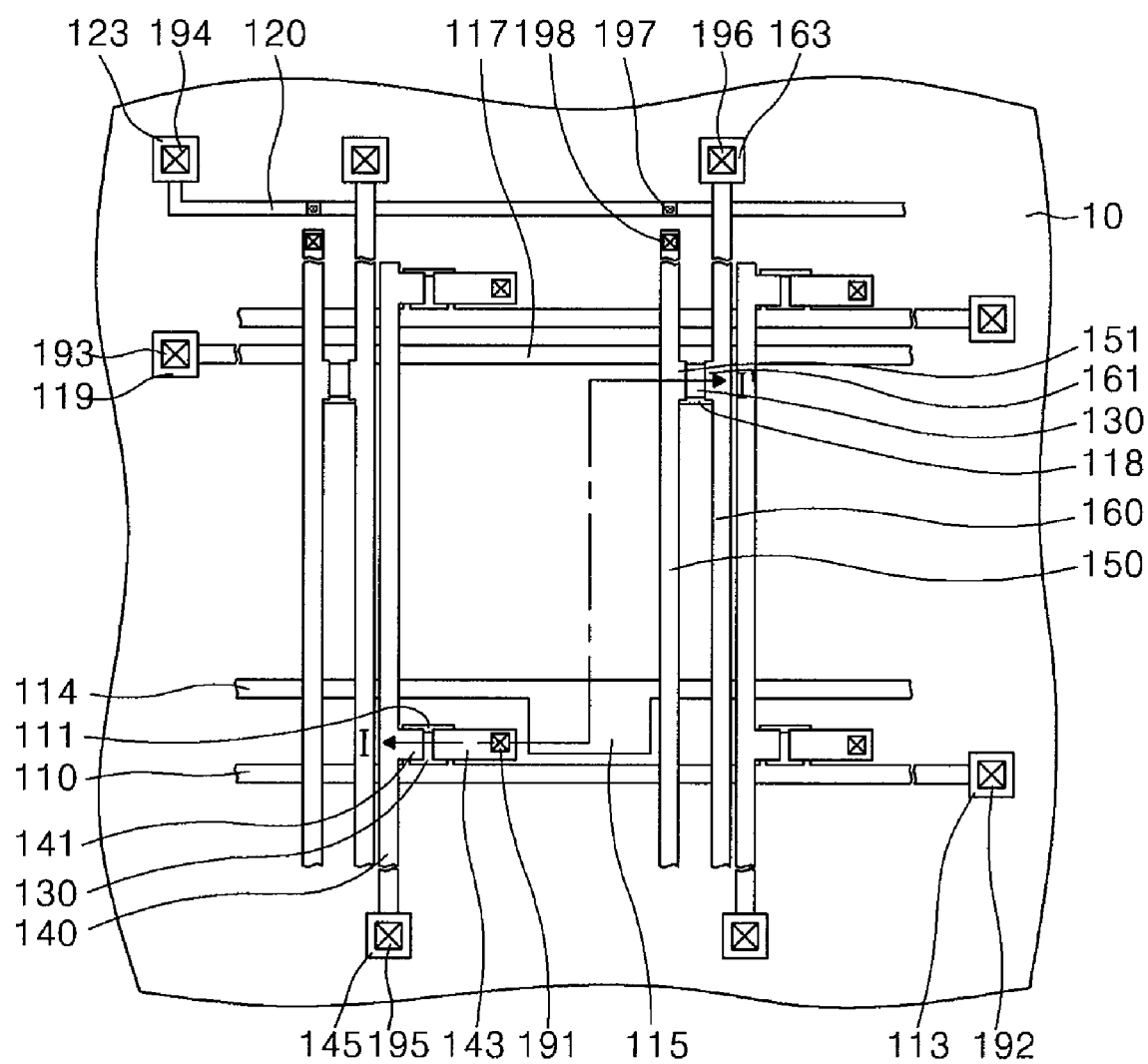
Figure 12B:
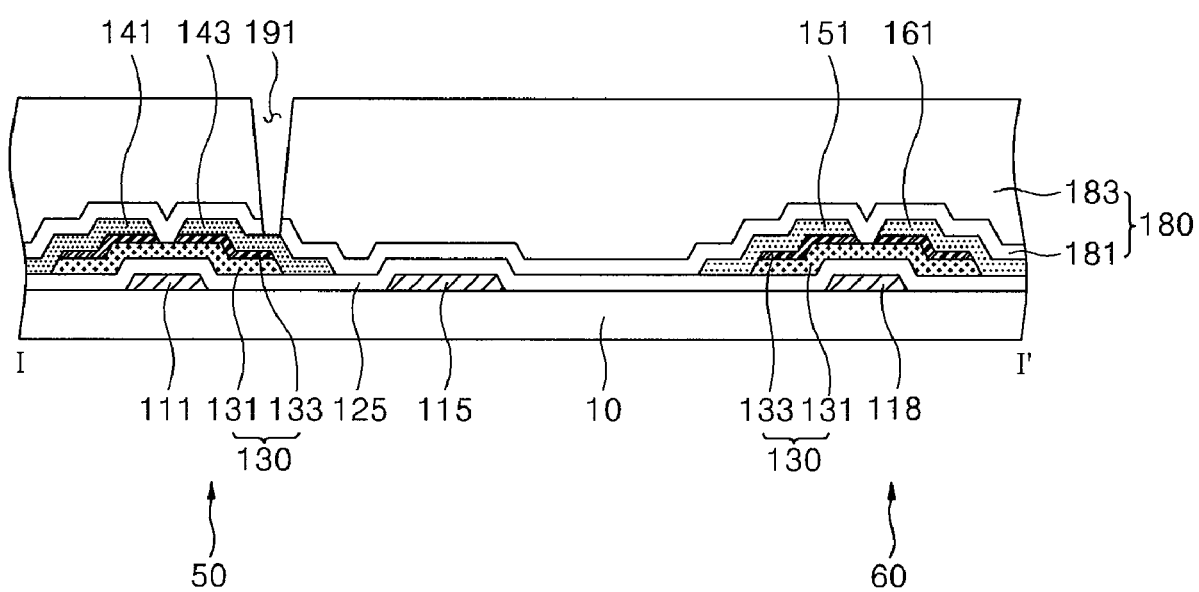

Referring to FIG. 11 to FIG. 12B, the protective layer 180 is formed on the second metal pattern group. The protective layer 180 includes a first protective layer 181, a second protective layer 183, and first to eighth contact holes 191, 192, 193, 194, 195, 196, 197, and 198.

More specifically, the first protective layer 181 is formed by depositing an inorganic material over an entire surface of the substrate 10 on which the second metal pattern group is formed. The second protective layer 183 is formed on the first protective layer 181 and is formed with a thicker thickness than the first protective layer 181. The first to eighth contact holes 191, 192, 193, 194, 195, 196, 197, and 198 are formed by penetrating the first and second protective layers 181 and 183.

The first contact hole 191 exposes a portion of the driving drain electrode 143 by penetrating the first and second protective layers 181 and 183. The second to fourth contact holes 192, 193, and 194 expose the gate pad 192, the sensor gate pad 119, and the sensor data common connection pad 123, respectively, by penetrating the gate insulation layer 125, and the first and second protective layers 181 and 183. The fifth and sixth contact holes 195 and 196 expose the data pad 145 and the sensor output pad 163, respectively, by penetrating the first and second protective layers 181 and 183. The seventh contact hole 197 exposes a portion of the sensor data common connection line 120 by penetrating the gate insulation layer 125, and the first and second protective layers 181 and 183.

The eighth contact hole 198 exposes a portion of the sensor data common line 150 by penetrating the first and second protective layers 181 and 183.

Figure 13A:
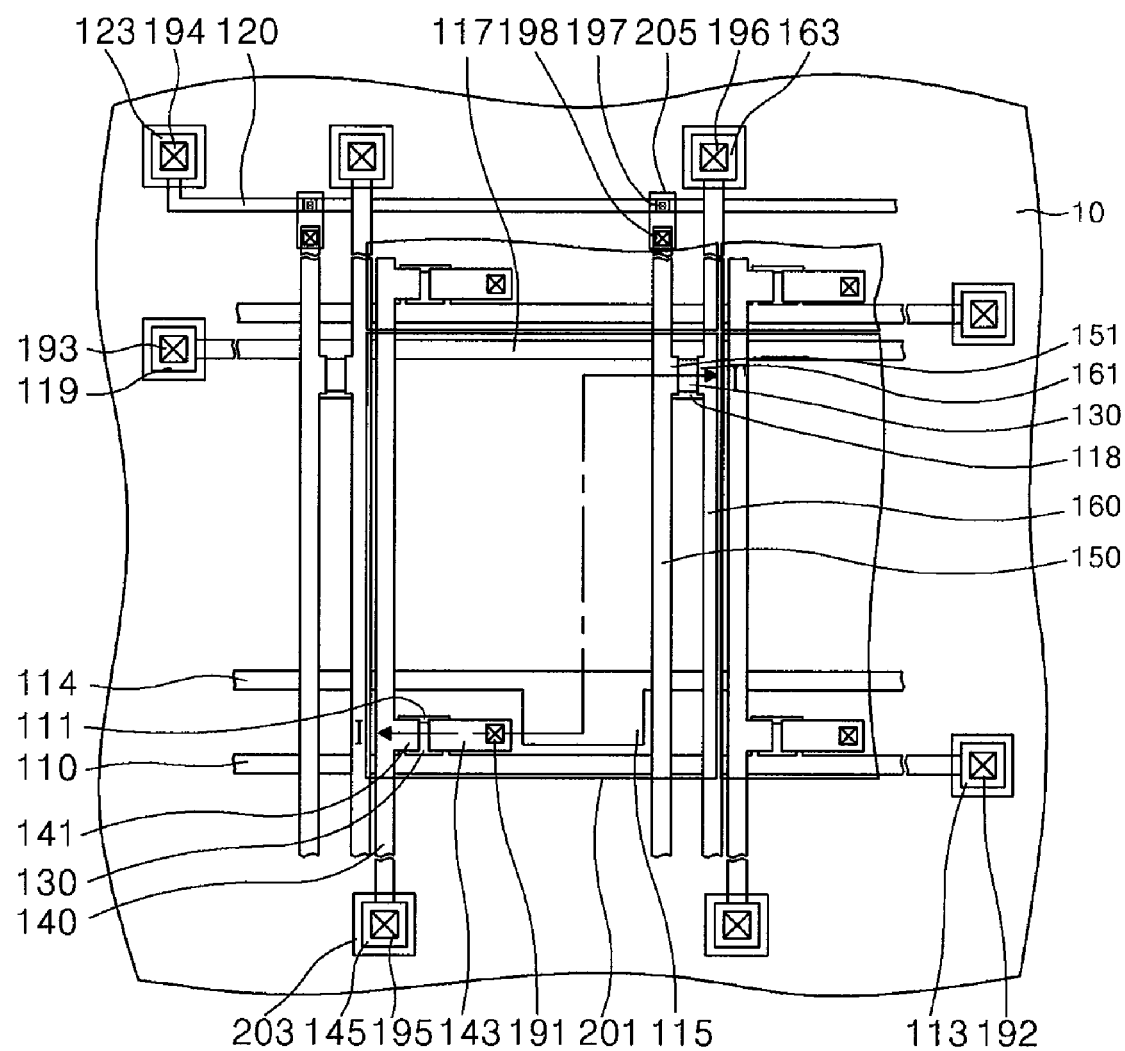
Figure 13B:
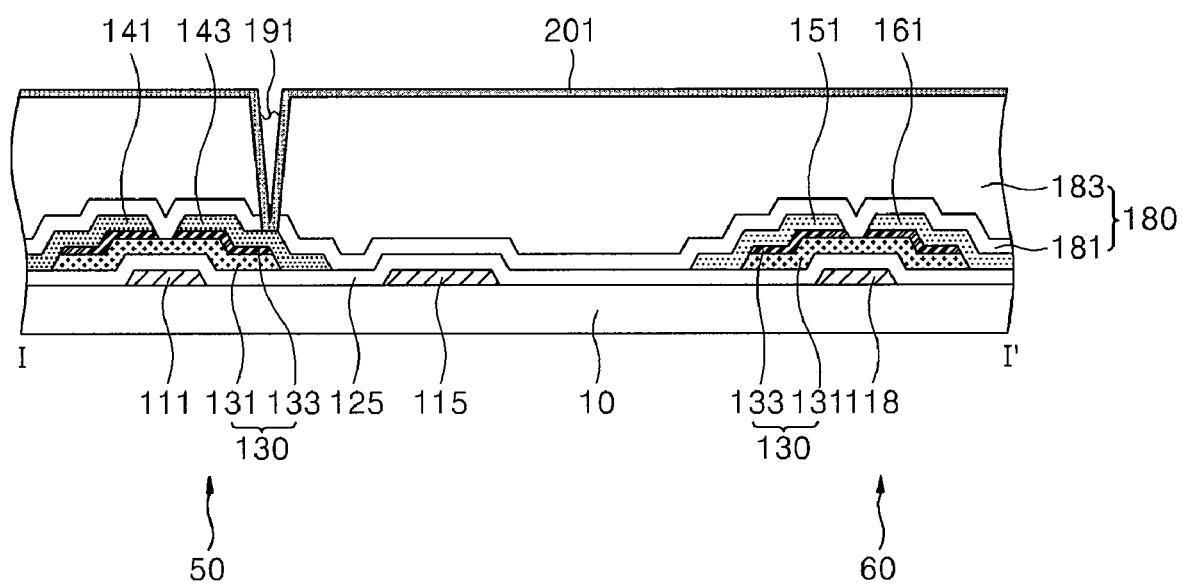

Referring to FIG. 13A and 13B, a third metal pattern group is formed on the protective layer 180. The third metal pattern group includes a pixel electrode 201, a pad connection electrode 203, and a connection electrode 205.

More specifically, the pixel electrode 201 is formed to be electrically connected to a portion of the driving drain electrode 143 through the first contact hole 191. The pixel electrode 201 is patterned correspondingly to a pixel area. The pad connection electrode 203 is formed to be connected to the gate pad 113, the sensor gate pad 119, the sensor data common connection pad 123, the data pad 145 and the sensor output pad 163 through the second to sixth contact holes 192, 193, 194, 195, and 196, respectively. The pad connection electrode 203 is formed with a predetermined size corresponding to a portion of the driving circuit (not shown). The connection electrode 205 is formed to be connected to the sensor data common connection line 120 and the sensor data common line 150 through the seventh and eighth contact holes 197 and 198, respectively. Therefore, the connection electrode 205 electrically connects the sensor data common connection line 120 to the sensor data common line 150.

FIG. 14A to FIG. 22B are views illustrating a method of manufacturing a TFT substrate according to a second embodiment of the present invention. As is explained fully below, in this second embodiment a high temperature process is used to for the TFT associated with the driving TFT and a low temperature process is used in forming the sensor TFT. This is in contrast to the first embodiment which uses a low temperature process for forming both TFTS.

The method of manufacturing the TFT substrate includes forming a first metal pattern group, forming a first triple layer, forming a second metal pattern group, forming a second triple layer, forming a third metal pattern group, forming a protective layer 380, and a fourth metal pattern group.

Figure 14A:
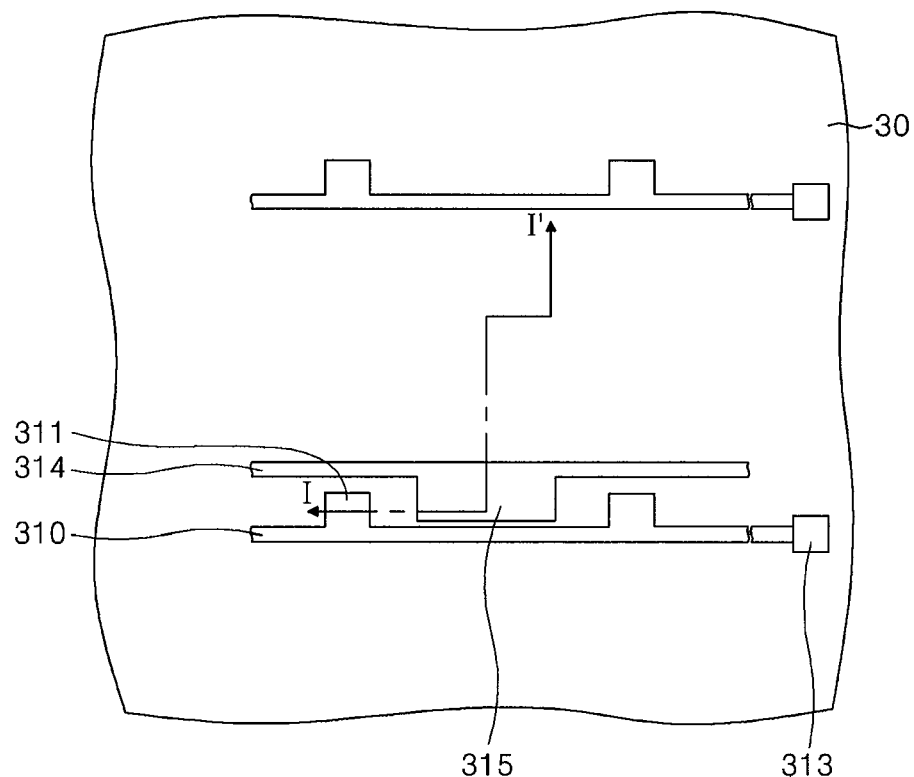
FIG. 14A to FIG. 22B are views illustrating a method of manufacturing a TFT substrate according to a second embodiment of the present invention.
Figure 14B:
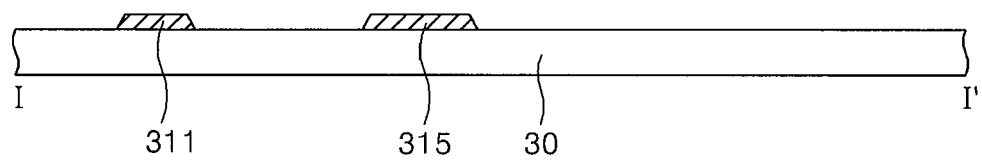

Referring to FIG. 14A and FIG. 14B, a first metal pattern group is formed on a substrate 30. The first metal pattern group includes a gate line 310, a driving gate electrode 311, a gate pad 313, a storage line 314, and a storage electrode 315.

Specifically, the first metal pattern group is formed on the substrate 30 by forming a metal layer through a deposition method such as sputtering and by patterning the metal layer through a photolithography process and an etching process. The substrate 30 is made of a transparent insulative material such as glass or plastic. The gate line 310 and the storage line 314 are formed to be extended in a horizontal direction of the substrate 30. The driving gate electrode 311 and the storage electrode 315 protrude from one side of each of the gate line 310 and the storage line 314, respectively.

Figure 15:
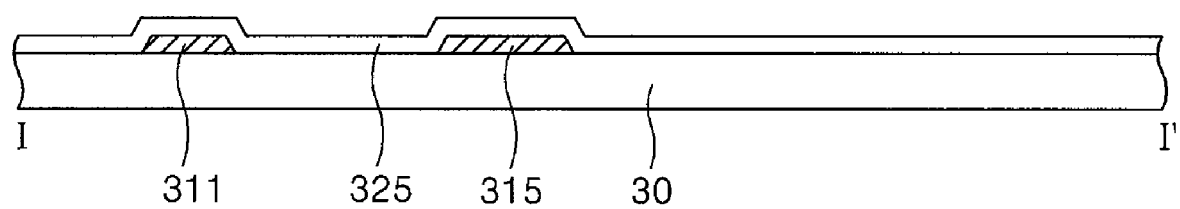
Figure 16A:
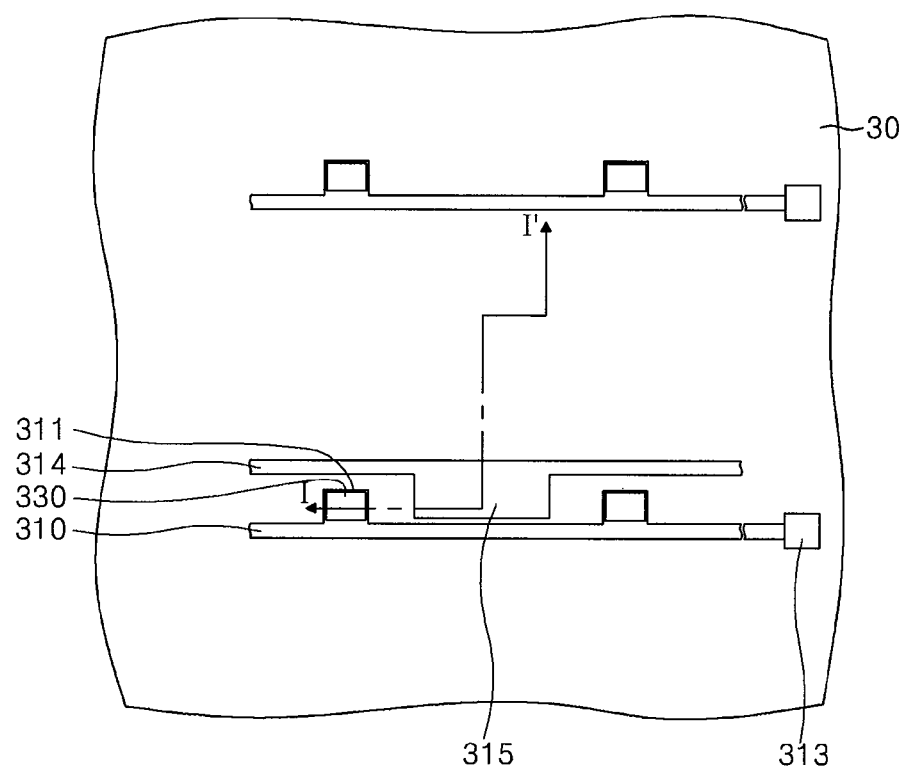
Figure 16B:
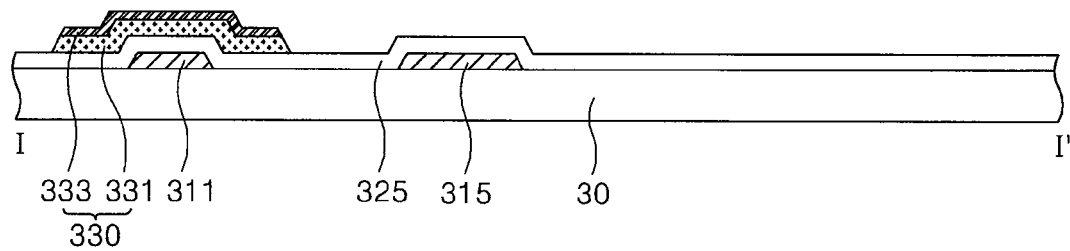

Referring to FIG. 15, FIG. 16A, and FIG. 16B, a first triple layer is formed on the first metal pattern group. The first triple layer includes a first insulation layer 325, a first active layer 331, and a first ohmic contact layer 333.

Specifically, the first insulation layer 325 is formed over an entire surface of the substrate 30. The first active layer 331 and the first ohmic contact layer 333 are sequentially staked on the first insulation layer 325. The first active layer 331 and the first ohmic contact layer 333 are patterned in a portion where the first active layer 331 and the first ohmic contact layer 333 overlap the driving gate electrode 311. The first triple layer is formed by a high-temperature deposition process. The first triple layer may be formed by a PECVD method at a temperature of about 370° C. and a high frequency power of 300 W or less.

Figure 17A:
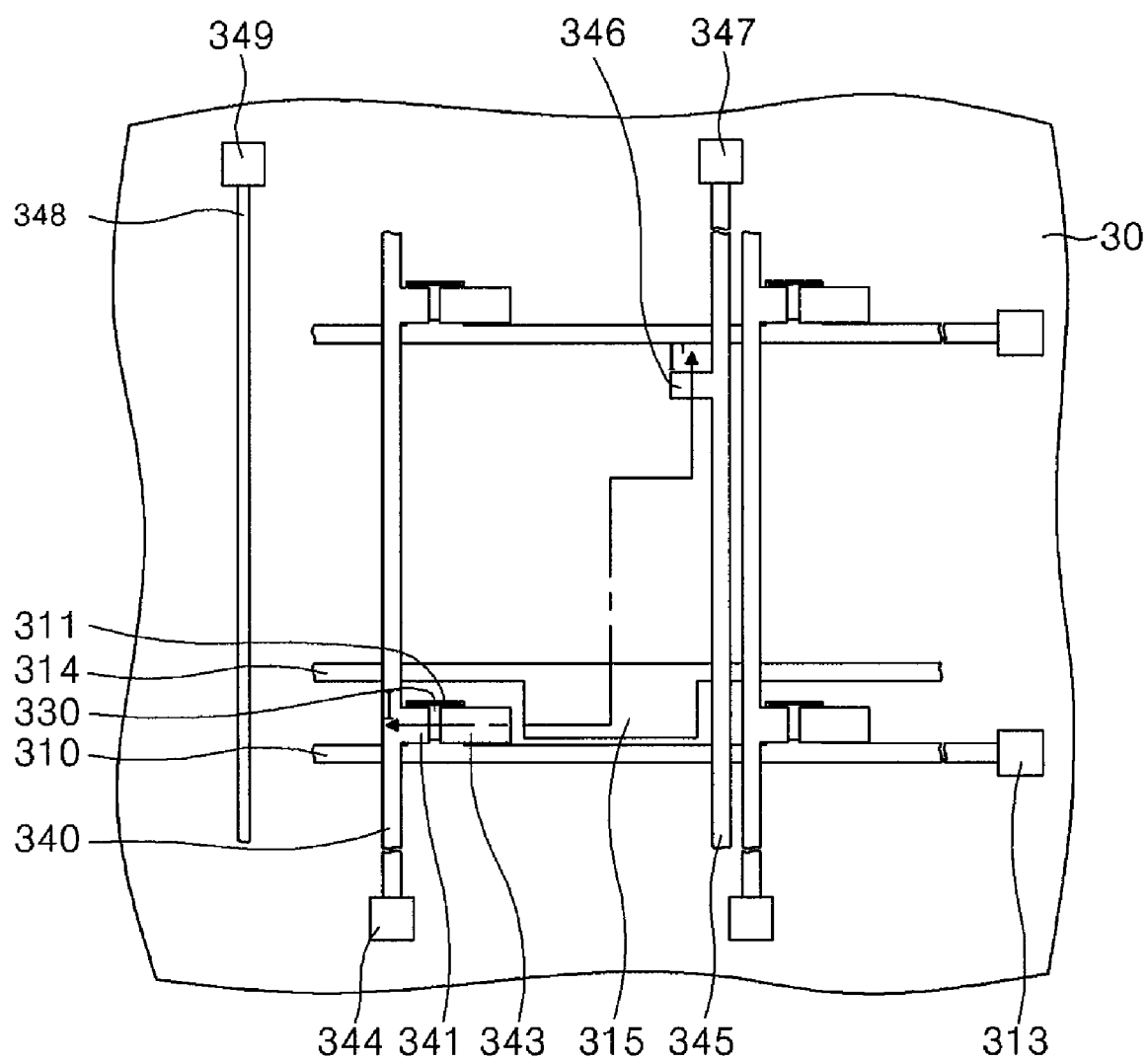
Figure 17B:
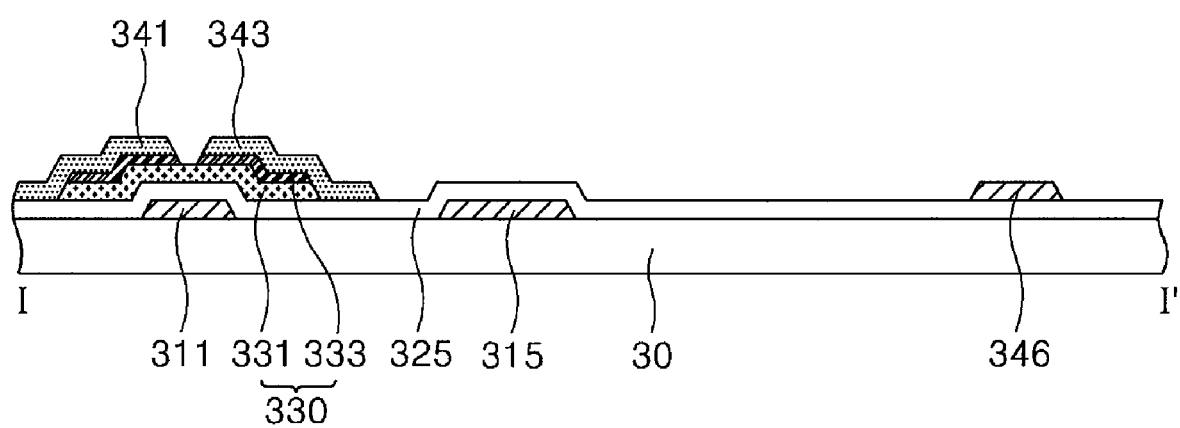

Referring to FIG. 17A and FIG. 17B, a second metal pattern group is formed on the first triple layer. The second metal pattern group includes a data line 340, a driving source electrode 341, a driving drain electrode 343, a data pad 344, a sensor gate line 345, a sensor gate electrode 346, a sensor gate pad 347, a sensor data common connection line 348, and a sensor data common connection pad 349.

Specifically, the data line 340 is extended in a vertical direction of the substrate 30 and patterned to locate the data pad 344 at one end of the data line 340. The driving source electrode 341 protruding from the data line 340 and the driving drain electrode 343 facing the driving source electrode 341 are patterned. The sensor gate line 345 is extended in the vertical direction of the substrate 30 in parallel with the data line 340 and patterned to locate the sensor gate pad 347 at one end of the sensor gate line 345. The sensor gate electrode 346 protrudes from the sensor gate line 345. The sensor data common connection line 348 is extended in the vertical direction at one edge side of the substrate 30 and patterned to locate the sensor data common connection pad 349 at one end of the sensor data common connection line 348.

Figure 18:
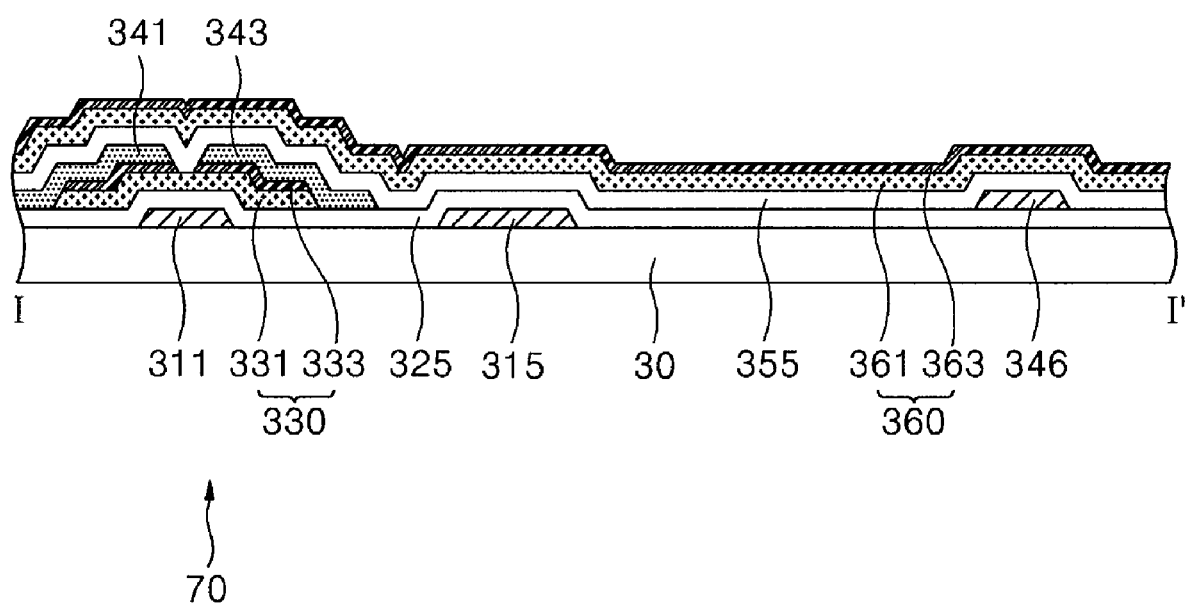

Referring to FIG. 18, a second triple layer is formed on the second metal pattern group. The second triple layer includes a second insulation layer 355, a second active layer 361, and a second ohmic contact layer 363.

Specifically, the second insulation layer 355 is formed over an entire surface of the substrate 30. The second active layer 361 and the second ohmic contact layer 363 are sequentially staked on the second insulation layer 355. The second triple layer is formed by a low-temperature deposition process. For example, the second triple layer is formed by a PECVD method at a temperature of about 100° C. to about 180° C. and a high frequency power of 300 W or less. The second triple layer may be formed at a temperature of about 130° C. and the high frequency power from 150 W to 300 W.

The second insulation layer 355 may be formed with a thin thickness for preventing reverse taper. Reverse taper means that a lower portion is more etched than an upper portion in an etching process.

Figure 19A:
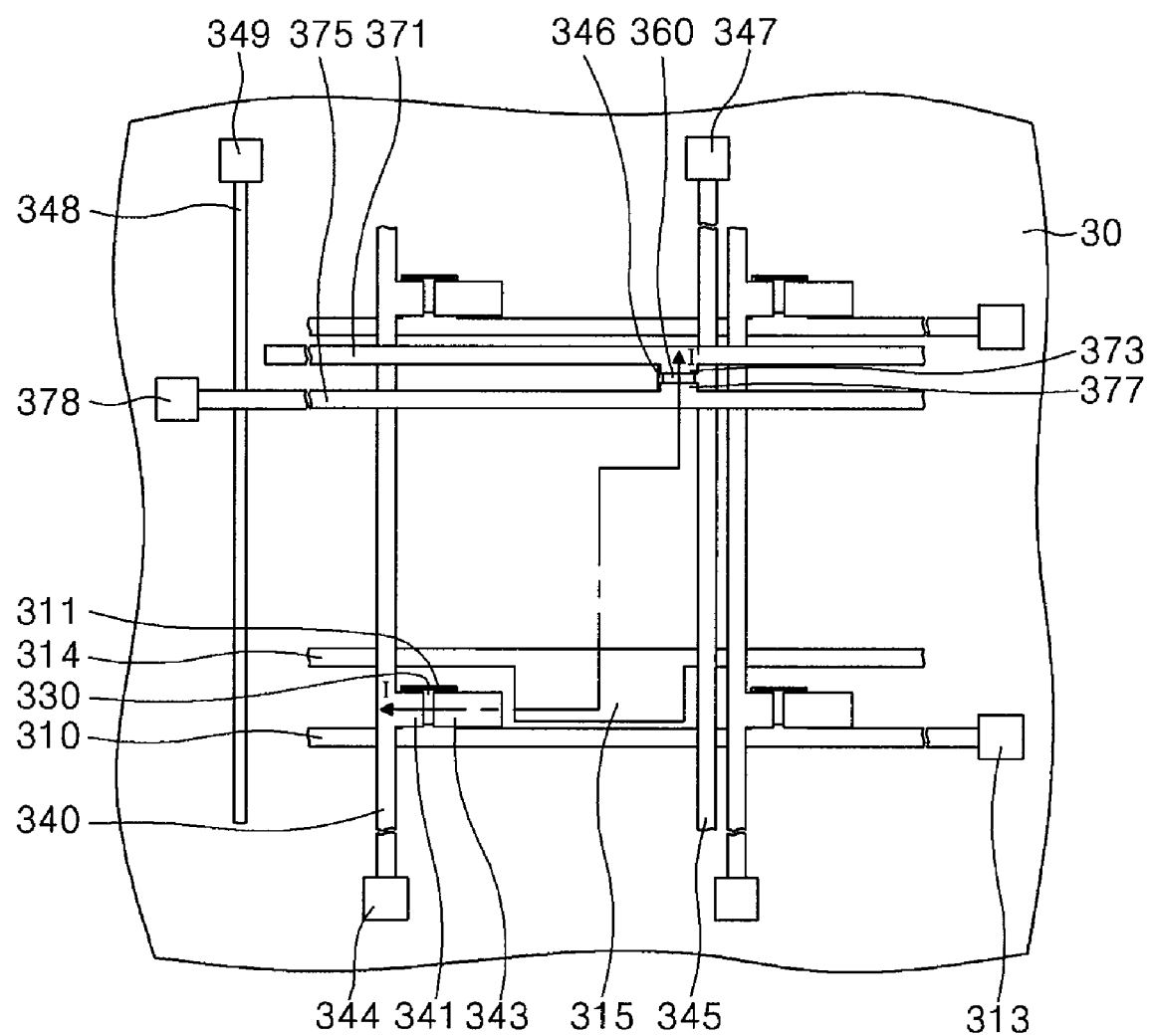
Figure 19B:
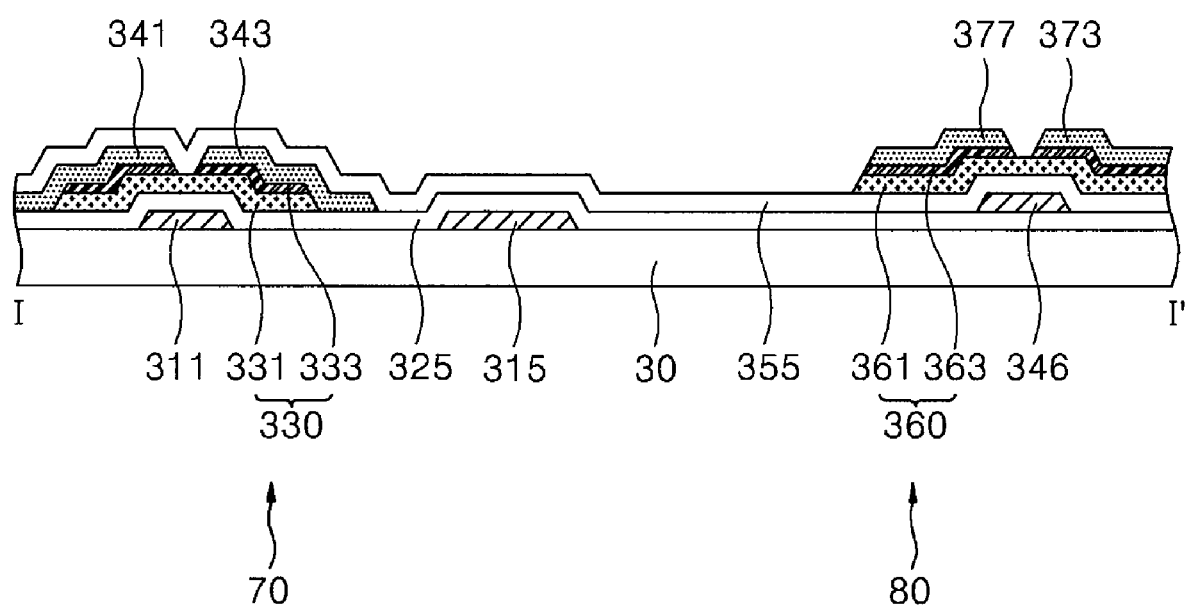

Referring to FIG. 19A and FIG. 19B, a third metal pattern group is formed on the second triple layer. The third metal pattern group includes a sensor data common line 371, a sensor drain electrode 373, a sensor output line 375, a sensor source electrode 377, and a sensor output pad 378.

The third metal pattern group is formed by depositing a metal layer on the second triple layer. The third metal pattern group is formed by simultaneously patterning the deposited metal layer and the second triple layer. The sensor data common line 371 and the sensor output line 375 are patterned to be extended in the horizontal direction of the substrate 30 in parallel with each other. The sensor data common line 371 is patterned to locate the sensor drain electrode 373 at its one side. The sensor output line 375 is patterned to locate the sensor source electrode 377 at its one side. The sensor drain electrode 373 faces the sensor source electrode 377 based on the sensor gate electrode 346.

Figure 20:
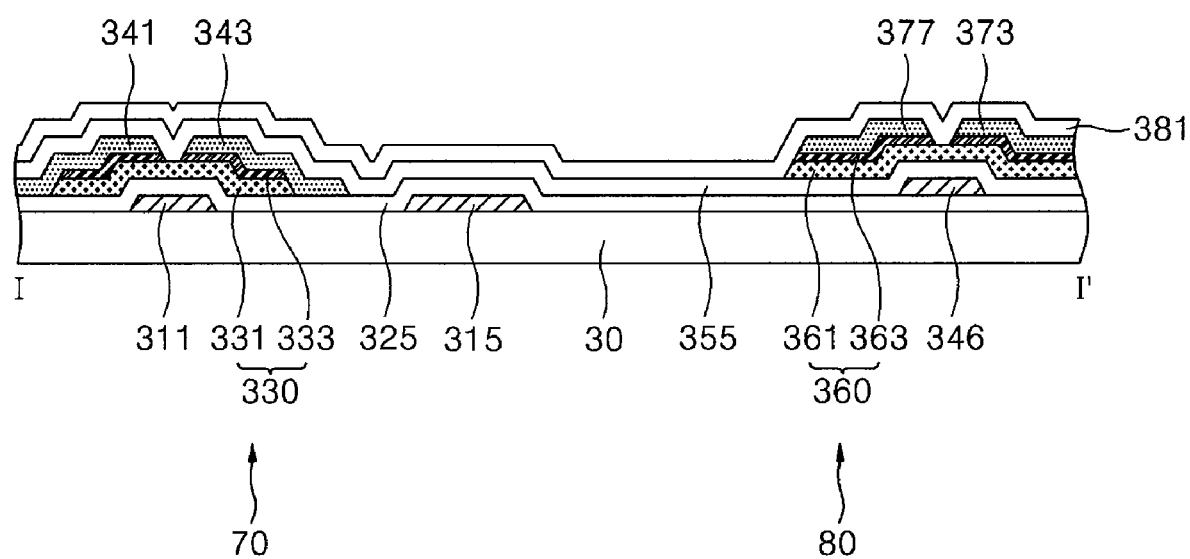
Figure 21A:
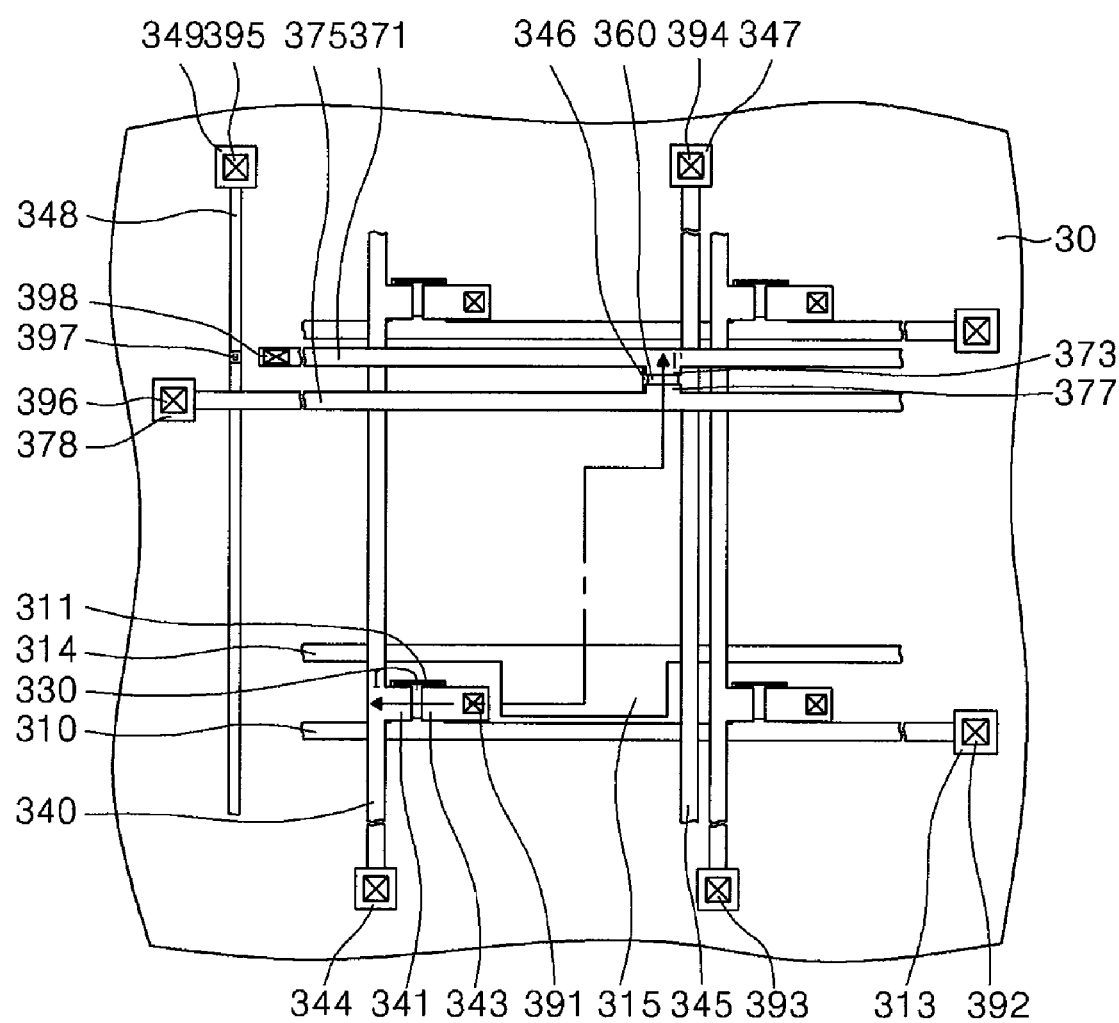
Figure 21B:
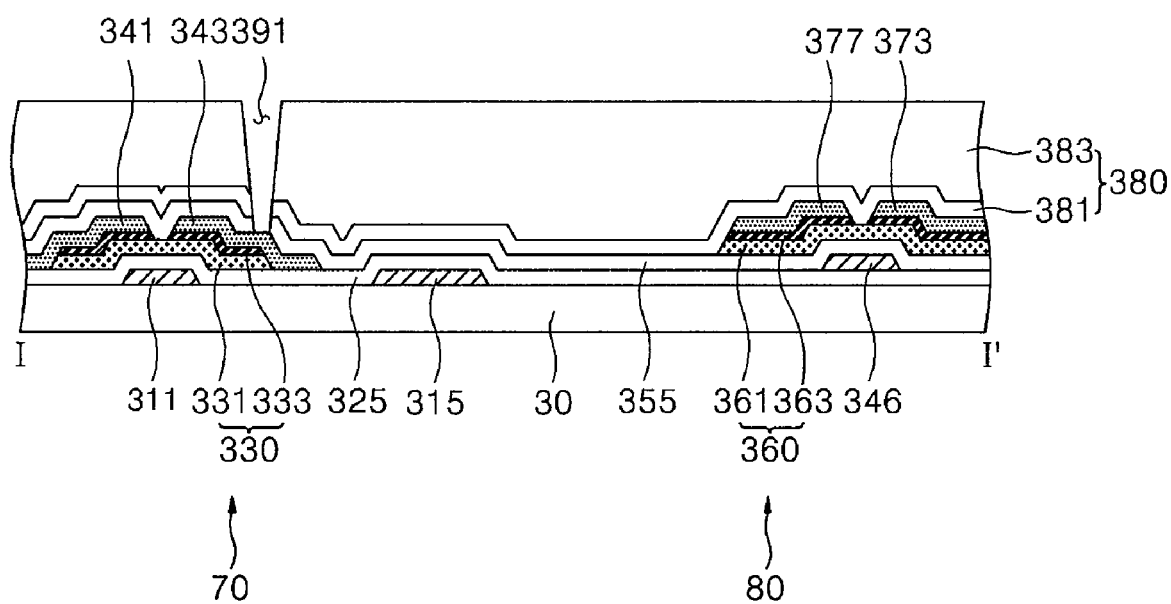

Referring to FIG. 20, FIG. 21A, and FIG. 21B, the protective layer 380 is formed on the third metal pattern group. The protective layer 380 includes a first protective layer 381, a second protective layer 383, and first to eighth contact holes 391, 392, 393, 394, 395, 396, 397, and 398.

Specifically, the first protective layer 381 is formed by depositing an inorganic material over an entire surface of the substrate 30 on which the third metal pattern is formed. The second protective layer 383 is formed on the first protective layer 381 and is formed with a thicker thickness than the first protective layer 381. The first to eighth contact holes 391, 392, 393, 394, 395, 396, 397, and 398 are formed by penetrating the first and second protective layers 381 and 383.

The first contact hole 391 exposes a portion of the driving drain electrode 343 by penetrating the second insulation layer 355, and the first and second protective layers 381 and 383. The second to fourth contact holes 382, 393 and 394 expose the gate pad 313, the sensor gate pad 347, and the sensor data common connection pad 349, respectively, by penetrating the first and second insulation layers 325 and 355 and the first and second protective layers 381 and 383. The fifth and sixth contact holes 395 and 396 expose the data pad 344 and the sensor output pad 378, respectively, by penetrating the second insulation layer 355 and the first and second protective layers 381 and 383. The seventh contact hole 397 exposes a portion of the data common connection line 348 by penetrating the second insulation layer 355 and the first and second protective layers 381 and 383. The eighth contact hole 398 exposes a portion of the sensor data common line 371 by penetrating the first and second protective layers 381 and 383.

The first protective layer 381 may be formed with a thin thickness for preventing reverse taper generated during an etching process.

Figure 22A:
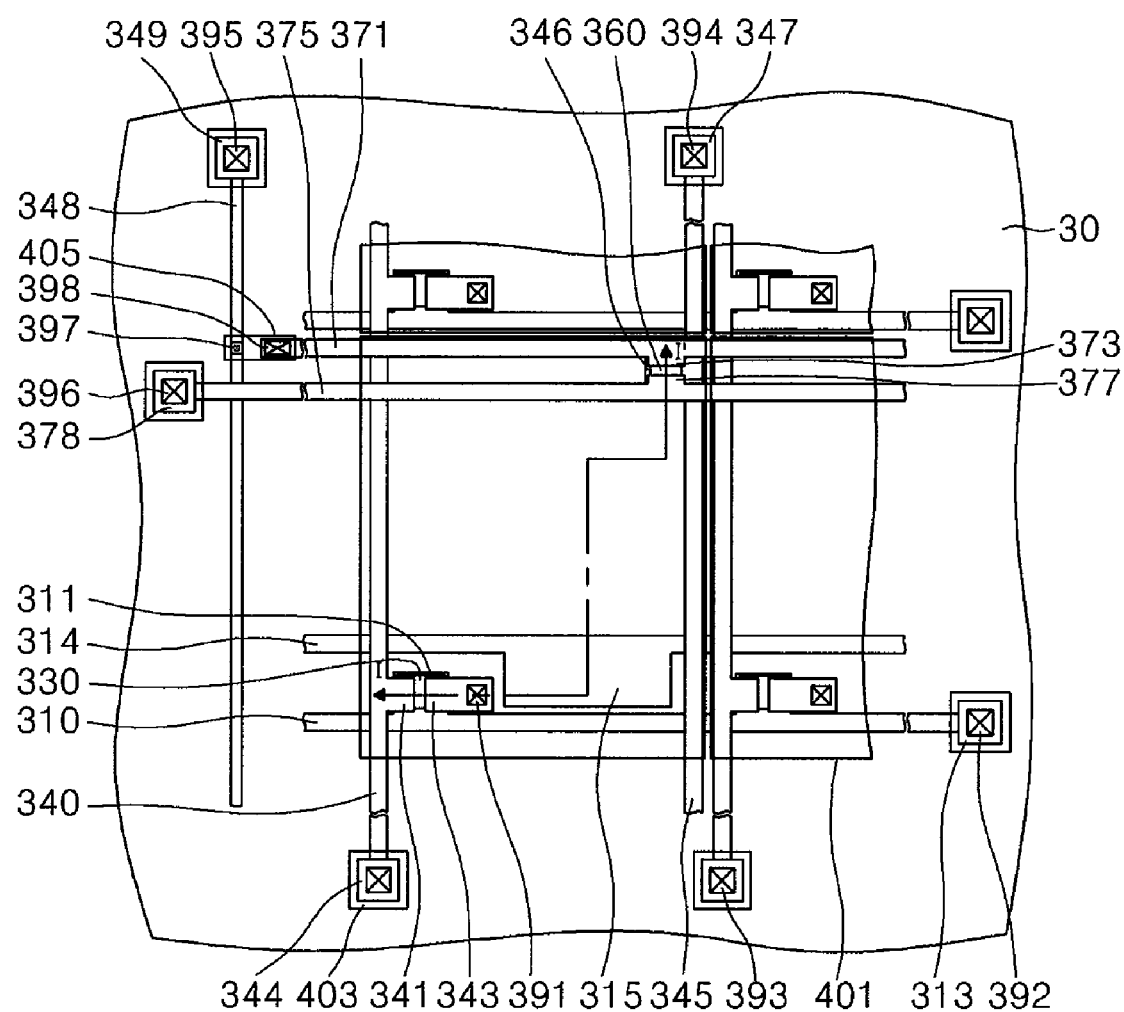
Figure 22B:
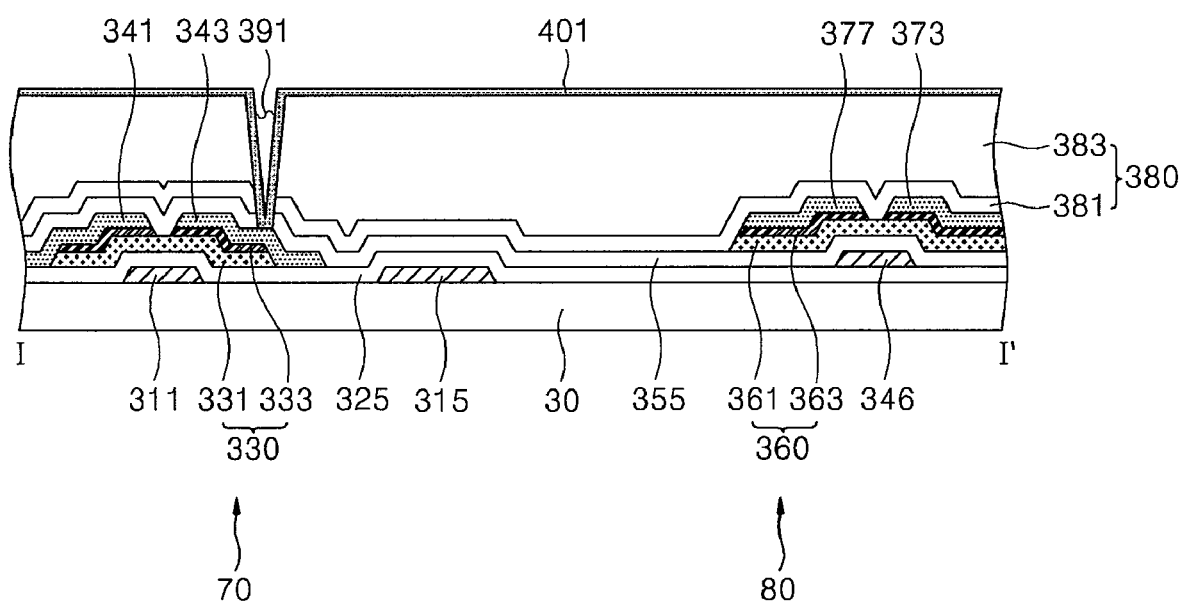

Referring to FIG. 22A and FIG. 22B, a fourth metal pattern group is formed on the protective layer 380. The fourth metal pattern group includes a pixel electrode 401, a pad connection electrode 403, and a connection electrode 405.

Specifically, the pixel electrode 401 is formed to be electrically connected to a portion of the driving drain electrode 343 through the first contact hole 391. The pixel electrode 401 is patterned correspondingly to a pixel area. The pad connection electrode 403 is formed to be connected to the gate pad 313, the sensor gate pad 347, the sensor data common connection pad 349, the data pad 344, and the sensor output pad 378 respectively through the second to sixth contact holes 392, 393, 394, 395, and 396. The pad connection electrode 403 may be formed with a predetermined size corresponding to a connection portion of the driving circuit. The connecting electrode 405 is formed to be electrically connected to the sensor data common connection line 348 and the sensor data common line 371 through the seventh and eighth contact holes 397 and 398.

A driving method of a touch screen panel using a TFT substrate according to an embodiment of the present invention is described in detail with reference to FIG. 1.

A constant voltage is applied to the sensor drain electrode 151 through the sensor data common connection line 120 to maintain the constant voltage. For example, a voltage of 10V is applied to the sensor drain electrode 151.

A gate voltage of a gate-on state is applied to the sensor gate electrode 118 to maintain the difference in the amount of current depending on whether external light exists or not. For example, a voltage of 10V or more is applied to the sensor gate electrode 118.

A voltage that is same as the voltage applied to the sensor drain electrode 151 is applied to the sensor source electrode 161 so that current does not flow between the sensor source electrode 161 and the sensor drain electrode 151. For example, a voltage of 10V may be applied to the sensor drain electrode 151 and the sensor source electrode 161.

Next, the sensor output line 160 on the TFT substrate is sequentially scanned to search for a user's input position. For example, a voltage of 0V is sequentially applied to a plurality of sensor output lines 160 to which a voltage of 10V has been applied and then a voltage of 10V is applied to the plurality of sensor output lines 160. The plurality of sensor output lines 160 is sequentially scanned so that the sensor output lines 160 to which a voltage of 0V is applied are shifted. Then a voltage of 0V is applied to the sensor source electrode 161 and a voltage difference occurs between the sensor source electrode 161 and the sensor drain electrode 151. Accordingly, current flows through the semiconductor layer 130.

A gate off voltage is sequentially applied to the sensor gate line 117 at the time of scanning the sensor output lines 160. For example, a gate off voltage of about −10V to about 0V is applied to the sensor gate line 117. That is, the gate off voltage is applied to the sensor gate electrode 118 so that current does not flow into the semiconductor layer 130. Accordingly, the photo on and photo off currents flow into the semiconductor layer 130 of the sensor TFT 60 depending on external light exists or not.

When a user touches a screen panel, external light is not transmitted to the sensor TFT 60 of an input point to generate the difference between the photo on current and photo off current. The sensor TFT 60 supplies the reduced current to a driving circuit. The driving circuit calculates the coordinates of the user's touching point through scanning information of the sensor output line 160 and the sensor gate line 117.

The sensor TFT 60 may include a low current pass filter having a value between the photo on current and photo off current as a threshold value.

As described above, the TFT substrate according to the present invention can greatly improve the input sensitivity of an optical-sensing touch screen panel by forming a semiconductor layer of a sensor TFT by a low-temperature deposition process.

In addition, the TFT substrate can simplify a manufacturing process and save manufacturing costs by forming a driving TFT by a low-temperature deposition process. Moreover, since the driving TFT and sensor TFT of the TFT substrate are formed at different temperatures, the degradation of driving characteristic is prevented and light sensitivity can be improved.

Furthermore, since a touch screen panel using the TFT substrate improves light sensitivity of the sensor TFT, user's input point can be rapidly searched.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A method of manufacturing a thin film transistor substrate, comprising:
   forming a first metal pattern group on a substrate, the first metal pattern group including a driving gate electrode and a sensor gate electrode;
   forming at a predetermined temperature a semiconductor layer on the first metal pattern group;
   forming a second metal pattern group on the semiconductor layer, the second metal pattern group including a driving source electrode, a driving drain electrode, a sensor drain electrode, and a sensor source electrode;
   forming a protective layer having a contact hole on the second metal pattern group; and
   forming a pixel electrode on the protective layer;
   wherein the semiconductor layer is formed at a temperature of about 100° C. to about 180° C.
2. The method of claim 1, wherein the forming the semiconductor layer is formed at a temperature of about 125° C. to about 135° C.

3. The method of claim 2, wherein a sensor thin film transistor comprises the sensor gate electrode, the sensor source electrode and the sensor drain electrode.

4. The method of claim 3, wherein the sensory thin film transistor has a signal-to-noise ratio equal to or greater than about 200 when a gate-off voltage applied to the sensor gate electrode is equal to or less than about 0V.

5. The method of claim 1, further comprising forming a gate insulation layer on the first metal pattern group at a temperature of about 100° C.

6. The method of claim 5, wherein the gate insulation layer being formed at a temperature of about 125° C. to about 135° C.

* * * * *